(12) United States Patent
Ohsawa et al.

(10) Patent No.: US 6,325,865 B2
(45) Date of Patent: Dec. 4, 2001

(54) METHOD FOR DRYING SUBSTRATE

(75) Inventors: Tadayasu Ohsawa; Hiromitsu Kurauchi, both of Tokyo (JP)

(73) Assignee: Kaijo Corporation (JP)

( * ) Notice: Subject to any disclaimer, the term of this patent is extended or adjusted under 35 U.S.C. 154(b) by 0 days.

(21) Appl. No.: 09/767,301

(22) Filed: Jan. 23, 2001

Related U.S. Application Data

(62) Division of application No. 09/190,337, filed on Nov. 12, 1998, now Pat. No. 6,244,281.

(30) Foreign Application Priority Data

| Nov. 19, 1997 | (JP) | 9-333720 |
| Jul. 29, 1998 | (JP) | 10-214599 |

(51) Int. Cl.$^7$ .................................................. B08B 3/04
(52) U.S. Cl. ............................ 134/32; 134/42; 134/902
(58) Field of Search ............................ 134/32, 42, 133, 134/135, 140, 164, 902

(56) References Cited

U.S. PATENT DOCUMENTS

| 4,722,752 | 2/1988 | Steck | 134/25.4 |
| 4,911,761 | 3/1990 | McConnell et al. | 134/11 |
| 5,143,103 | 9/1992 | Basso et al. | 134/98.1 |
| 5,569,330 | 10/1996 | Schild et al. | 134/1 |
| 5,571,337 | 11/1996 | Mohindra et al. | 134/25.4 |
| 5,730,162 | 3/1998 | Shindo et al. | 134/25.4 |
| 5,839,460 | 11/1998 | Chai et al. | 134/147 |
| 6,027,574 | 2/2000 | Fishkin et al. | 134/30 |

FOREIGN PATENT DOCUMENTS

| 0385536 | 9/1994 | (EP) . |
| 04349626 | 12/1992 | (JP) . |
| 05036668 | 2/1993 | (JP) . |
| 10022256 | 1/1998 | (JP) . |

*Primary Examiner*—Randy Gulakowski
*Assistant Examiner*—Saeed Chaudhry
(74) *Attorney, Agent, or Firm*—Lerner, David, Littenberg, Krumholz & Mentlik, LLP

(57) ABSTRACT

A method for drying a substrate after the substrate is rinsed in a rinsing bath in which a rinsing liquid is contained. The substrate is vertically held selectively by first and second holders. The second holder is located between and below the first holders. Each of the first and second holders includes grooves with which the substrate is engageable. When the level of the rinsing liquid downwardly passes past the grooves of the first holders, the substrate is held solely by the second holder. Then, when the level of the rinsing liquid downwardly passes past the grooves of the second holder, the substrate is held solely by the first holder.

8 Claims, 20 Drawing Sheets

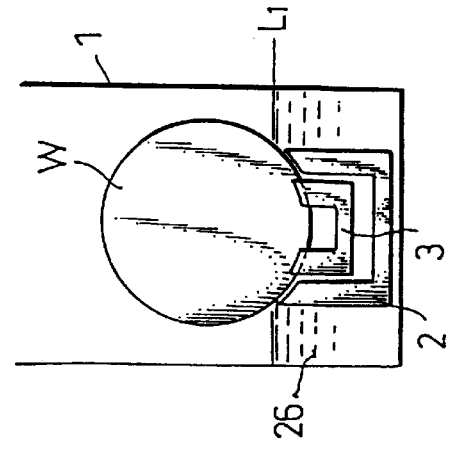
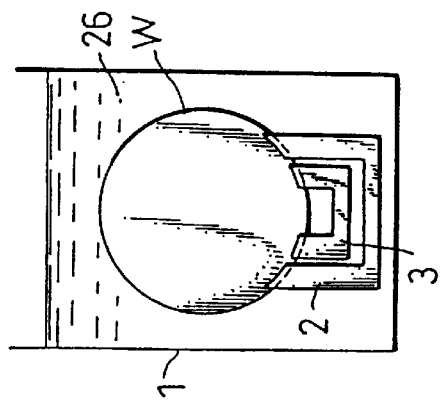
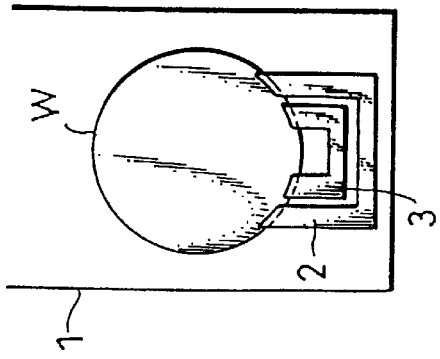
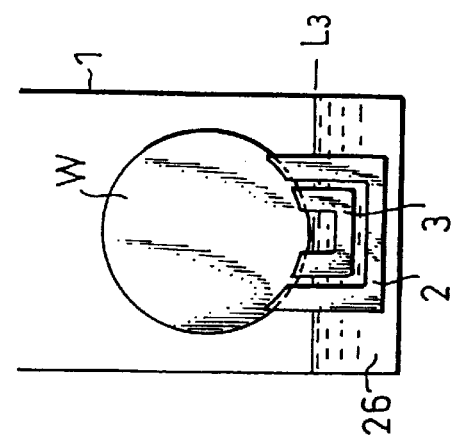
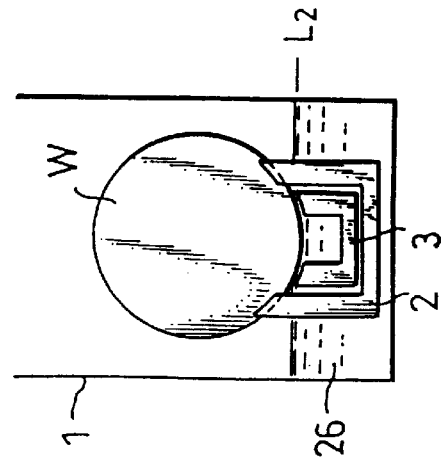

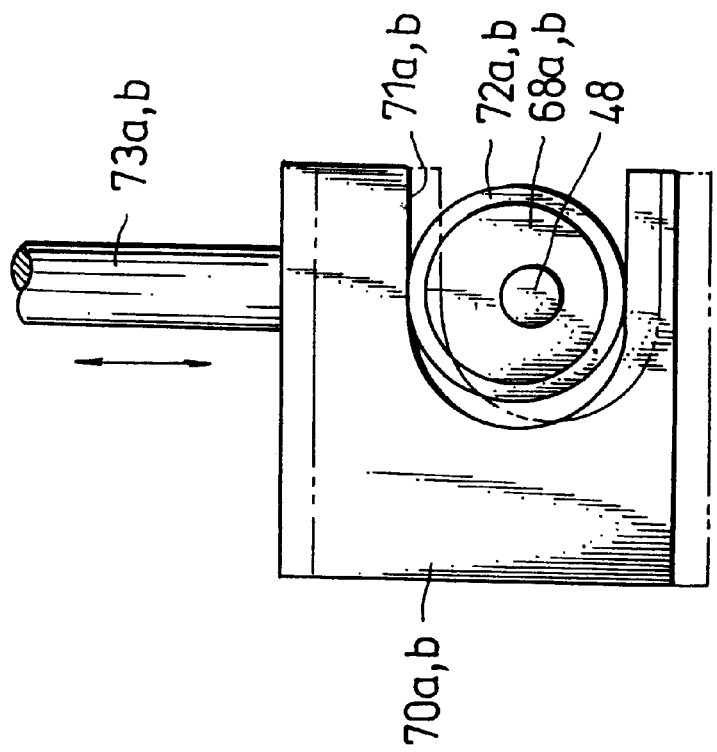
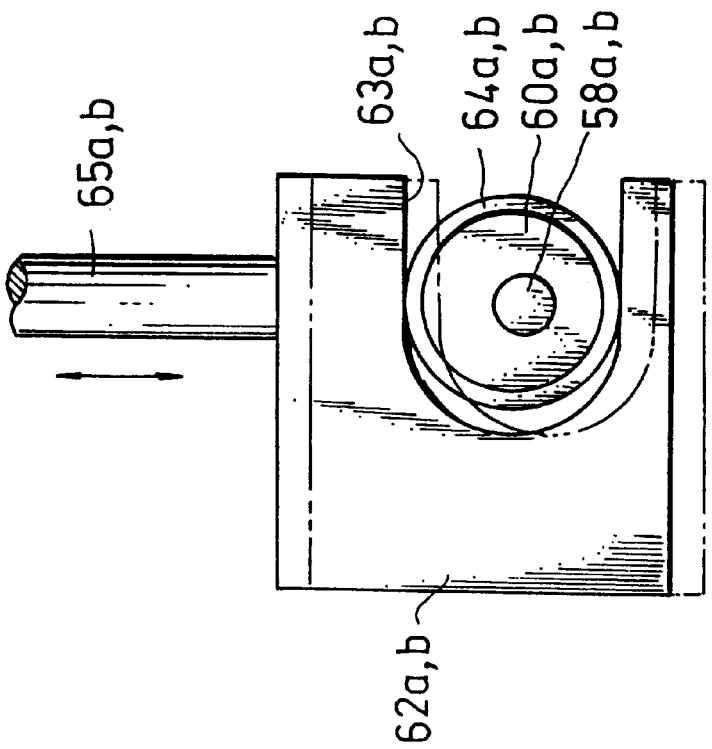

METHOD FOR DRYING SUBSTRATE

CROSS REFERENCE TO RELATED APPLICATIONS

The present application is a divisional of U.S. application Ser. No. 09/190,337, filed on Nov. 12, 1998, now U.S. Pat. No. 6,244,281 the disclosure of which is incorporated by reference herein.

BACKGROUND OF THE INVENTION

The present invention relates to a method and apparatus for drying a substrate such as a semiconductor wafer and a liquid crystal display glass after the substrate has been cleaned.

FIG. 28 illustrates one example of a drying process known in the art. This known process is called the "direct displacement isopropyl alcohol (IPA) drying process", also known as the "Marangoni drying process". A rinsing bath 92 is closed by a lid 91 and filled with pure water 93. After a semiconductor wafer W (hereinafter, simply referred to as a "wafer") has been cleaned by a chemical agent, it is immersed in the pure water 93 for rinsing purposes. A gas mixture of isopropyl alcohol vapor and nitrogen is then fed to the upper interior space of the rinsing bath 92 through gas inlet and outlet ports 95a and 95b to fill the upper interior space with the mixture.

Thereafter, a holder 94 on which the wafer W is placed is raised toward the upper interior space of the rinsing bath 92 as shown by phantom line in FIG. 28. when the wafer W upwardly passes past the level of the pure water, isopropyl alcohol is attached to the surface of the wafer W. A change in the surface tension of water due to concentration gradient of isopropyl alcohol causes a film of water attached to the surface of the wafer to be forced back to the pure water. This enables the surface of the wafer to be quickly dried out. In this example, the holder 94 is raised within the rinsing bath. Alternatively, the pure water 93 may be withdrawn from the rinsing bath 92 whereas the holder 94 is fixed in place.

FIG. 29 illustrates another example of a drying process known in the art. In this example, the holder 94 is fixed in place. A gas mixture of isopropyl alcohol vapor and nitrogen is fed to the upper interior space of the rinsing bath 92 through the gas inlet and outlet ports 95a and 95b. The gas pressure causes the pure water 93 to be displaced from the rinsing bath 92 through a drain valve 96. After the pure water 93 has been withdrawn, heated nitrogen is fed to the rinsing bath through second gas inlet and outlet ports 97a and 97b to thermally dry out the surface of the wafer. In this example, the pure water 93 is withdrawn. The holder 94 may alternatively be lifted.

FIG. 30 illustrates a further example of a drying process known in the art. This known process is called the "hot water drying process". The pure water 93 within the rinsing bath 92 is heated to a predetermined temperature. The wafer W is immersed in the resulting hot water after it has been cleaned by a chemical agent. After the wafer has been rinsed, the holder 94 on which the wafer W is placed is raised to a position shown by phantom line in FIG. 30. The wafer is then dried by air or hot air. In this example, the holder 94 is lifted. The pure water 93 may alternatively be withdrawn from the rinsing bath 92 while the holder 94 may be fixed in place.

All of the known drying processes present the following common problems. As shown in FIG. 31A, the holder 94 includes a pair of support arms 94a. A plurality of Y-shaped wafer holding grooves 94b are formed in the upper ends of the support arms 94a. The wafer W is inserted into the grooves 94b whereby the wafer W is held in a vertical orientation. As shown, on an enlarged scale, in FIG. 32, the wafer W is constantly in contact with a portion of the wafer holding groove 94b.

As shown in FIG. 32, a water droplet 98 remains between the wafer W and the groove 94b when the wafer W is moved out of the pure water, or the pure water is withdrawn from the rinsing bath.

In such a case, a certain period of time is required to dry out the water droplet 98. This results in an increase in the time required to complete the drying process and brings about a reduction in the throughput of the apparatus. Moreover, watermarks are left on the surface of the wafer due to foreign substance contained within the water droplet while the water droplet 98 is being dried. Such watermarks may cause the wafer to malfunction.

SUMMARY OF THE INVENTION

Accordingly, it is an object of the present invention to provide a method and apparatus for drying a substrate such as a semiconductor wafer, a liquid crystal display glass and the like, which prevent water droplets from remaining between the substrate and a holder on which the substrate is held when the substrate is rinsed by pure water or a similar rinsing liquid.

According to one aspect of the present invention, there is provided a method for drying a substrate by displacing the substrate relative to a rinsing liquid after the substrate is rinsed in a rinsing bath in which the rinsing liquid is contained. The method comprises the steps of: providing a first holder vertically movably arranged in the rinsing bath and including at least one substrate holding groove, and a second holder vertically movably arranged in the rinsing bath below the first holder and including at least one substrate holding groove; substantially vertically holding the substrate solely by the second holder, with the substrate engaged with the substrate holding groove of the second holder, when a level of the rinsing liquid passes past the substrate holding groove of the first holder; and after the level of the rinsing liquid has passed the substrate holding groove of the first holder, raising the first holder to bring the substrate holding groove thereof into engagement with the substrate and lowering the second holder to disengage the substrate holding groove of the second holder from the substrate, to thereby substantially vertically hold the substrate solely by the first holder, with the substrate engaged with the substrate holding groove of the first holder, when the level of the rinsing liquid downwardly passes past the substrate holding groove of the second holder.

According to the method of the present invention, the substrate is maintained out of contact with each of the holders when the level of the rinsing liquid passes past the substrate holding groove of a corresponding one of the holders. This prevents water droplets from being left between the holder and the substrate.

In a preferred embodiment, after the level of the rinsing liquid has passed past the substrate holding groove of the first holder, the substrate holding groove of the first holder is dried and then brought into contact with the substrate.

In a preferred embodiment, when the level of the rinsing liquid passes a lower end of the substrate, the lower end of the substrate is kept in contact with a triangular edged member to make a portion of the rinsing liquid remaining on the lower end of the substrate flow away therefrom.

According to another aspect of the present invention, there is provided an apparatus for drying a substrate by displacing the substrate relative to a rinsing liquid after the substrate is rinsed in a rinsing bath in which the rinsing liquid is contained. The apparatus comprises a first holder arranged in the rinsing bath to hold the substrate in a substantially vertical orientation and including at least one substrate holding groove with which the substrate is engageable, a second holder arranged in the rinsing bath below the first holder so as to hold the substrate in a substantially vertical orientation and including at least one substrate holding groove with which the substrate is engageable, and a holder lifting mechanism arranged to substantially vertically move the first holder and the second holder. The holder lifting mechanism is operable to substantially vertically move the first holder and the second holder, so that the substrate is held solely by the second holder when a level of the rinsing liquid downwardly passes past the substrate holding groove of the first holder, and the substrate is held solely by the first holder when the level of the rinsing liquid downwardly passes past the substrate holding groove of the second holder.

According to the apparatus of the present invention, the substrate is maintained out of contact with each of the holders when the level of the rinsing liquid passes past the substrate holding groove of a corresponding one of the holders. This arrangement prevents water droplets from being left between the holder and the substrate and brings about a reduction in the time required to dry out the substrate. Also, no watermark remains on the surface of the substrate, thus preventing a reduction in yieldability of the substrate.

In a preferred embodiment, the holder lifting mechanism is located in the vicinity of a bottom of the rinsing bath. The holder lifting mechanism includes a housing for defining a sealed space therein. The holder lifting mechanism further includes, within the sealed space, a first eccentric cam, a second eccentric cam, a third eccentric cam, a first guide plate, a second guide plate and a third guide plate. The second eccentric cam and the third eccentric cam are located at opposite sides of the first eccentric cam. The first, second and third guide plates are connected to the first, second and third eccentric cams, respectively and vertically moved when the first, second and third eccentric cams are rotated. The holder lifting mechanism further includes an actuator means for rotating the first, second and third eccentric cams. The first holder is composed of two holder members between which the second holder is interposedly located. One of the holder members is connected to the second guide plate, and the other holding member is connected to the third guide plate. The second holder is connected to the first guide plate. The housing may include a pair of upper and lower flexible sheets through which the second holder and the holder members are sealingly mounted on the first guide plate and the second and third guide plates, respectively. By such arrangement, the holder lifting mechanism is maintained out of direct contact with the rinsing liquid. Under the circumstances, no contaminant or foreign substance is introduced from the holder lifting mechanism into the rinsing liquid. The substrate can thus be dried with a high degree of cleanability.

In a preferred embodiment, the first holder and the second holder are vertically moved synchronously in opposite directions. When one of the first and second holders is raised, the other holder is lowered. This arrangement prevents a change in the volume of the rinsing liquid which may occur when the flexible sheets are vertically moved as well as a change in the level of the rinsing liquid which may occur when the first and second holders are vertically moved in opposite directions. The substrate can thus be dried with a high degree of cleanability since the rinsing water will in no way bubble or splash.

In a preferred embodiment, the holder lifting mechanism includes a pair of sealed casings spaced apart at a predetermined distance and located in the vicinity of a bottom of the rinsing bath. The holder lifting mechanism further includes a pair of first eccentric cams, a pair of second eccentric cams, a pair of third eccentric cams, a pair of first guide plates, a pair of second guide plates and a pair of third guide plates. The pairs of first, second and third eccentric cams and the pairs of first, second and third guide plates are located within the pair of respective sealed casings. The pairs of second and third eccentric cams are located at opposite sides of the pair of first eccentric cams. The pairs of first, second and third guide plates are connected to the pairs of first, second and third eccentric cams, respectively and vertically moved when the pairs of first, second and third eccentric cams are rotated. The holder lifting mechanism includes a first pipe extending between the pair of sealed casings in a watertight manner, a first rotary actuator contained within the first pipe and connected to the pair of first eccentric cams, a second pipe extending between the pair of sealed casings in a watertight manner and a second rotary actuator contained within the second pipe and connected to the pair of second eccentric cams. The holder lifting mechanism further includes a third pipe extending between the pair of sealed casings in a watertight manner and a driven shaft extending through the third pipe. The pair of third eccentric cams are connected to the driven shaft. The driven shaft has one end thereof linked to the second rotary actuator, whereby the driven shaft is rotated synchronously with the second rotary actuator. The first holder is composed of two holder members between which the second holder is interposedly located. one of the two holder members extends between the pair of second guide plates, and the other holder member extends between the pair of third guide plates. The second holder extends between the pair of third guide plates. By this arrangement, no obstacle which may inhibit the flow of the rinsing liquid exists between the bottom of the rinsing bath and the substrate. Thus, the substrate can be more efficiently dried out.

In a preferred embodiment, the second-holder is formed with a central opening extending vertically therethrough. The holder lifting mechanism includes a floating member floatable on the rinsing liquid and having a triangular edged top inserted into the central opening and adapted to be brought into contact with a lower end of the substrate by buoyancy thereof. The rinsing liquid may remain in the lower end of the substrate when the level of the rinsing liquid is downwardly moved away from the lower end of the substrate. However, this arrangement causes the rinsing liquid to flow along the edged top of the floating member and then, into the rinsing liquid. No water droplet thus remains at the lower end of the substrate, enabling the surface of the substrate and the grooves to be dried in a significantly short period of time.

The principle of the present invention will be explained with reference to FIGS. 1A to 1E.

As shown, wafers W are fixed in place, whereas pure water 26 is withdrawn from a rinsing bath 1. To carry out the present invention, first and second holders 2 and 3 are required to hold the wafers W. The second holder 2 is located below the first holder 3.

After the wafers W have been cleaned by a suitable chemical agent, the wafers W are vertically placed on the first and second holders 2 and 3 within the rinsing bath 1 as shown in FIG. 1A.

At the initial stage of the process, the wafers W may be held by the both first and second holders 2 and 3 or may be held by either the first holder 2 or the second holder 3. However, it is preferable that the wafers W be held solely by the second holder 3. This arrangement facilitates movement of the holders in the following steps.

After the wafers W are placed on the second holder 3, the pure water or a similar rinsing liquid 26 is introduced into the rinsing bath 1, as shown in FIG. 1B, so as to rinse out or remove the chemical agent and the like from the surfaces of the wafers W. After the wafers W have been rinsed, as the pure water 26 is withdrawn from the rinsing bath 1, the wafers W are dried by using the direct displacement IPA drying process or hot water drying process as explained above.

Then, as shown in FIG. 1C, when a level of the pure water 26 reaches the upper end of the first holder 2 or wafer holding grooves thereof as indicated at $L_1$, the first holder 2 is lowered by a predetermined distance, and the second holder 3 is controlled so as to hold the wafers W solely thereby, resulting in the wafers W being out of contact with the first holder 2. The second holder 3 has a height less than that of the first holder 2 and is located inside the first holder 2.

With the wafers W maintained out of contact with the first holder 2, no water droplet remains between the wafers W and the first holder 2 when the level of the pure water 26 is further lowered. As such, the wafers W and the grooves of the first holder 2 can be cleanly dried out in a significantly short period of time.

Next, as shown in FIG. 1D, when the level of the pure water 26 is lowered to the upper end of the second holder 3 or wafer holding grooves thereof as indicated at $L_2$, the first holder 2 is raised to hold the wafers W, and at the same time, the second holder 3 is moved down by a predetermined distance, so that the wafers W are held solely by the first holder 2. The wafers W are now maintained out of contact with the second holder 3 and held solely by the first holder 2.

With the wafers W maintained out of contact with the second holder 3, no water droplet remains between the wafers W and the second holder 3 when the level of the pure water 26 is further lowered. As such, the wafers W and the grooves of the second holder 3 can be cleanly dried out in a significantly short period of time.

Referring to FIG. 1E, the drying process is completed when the level of the pure water 26 reaches the lower ends of the wafers W as indicated at $L_3$, or when the pure water 26 has been fully withdrawn from the rinsing bath 1. Thereafter, the wafers W are transferred for a next step by means of a conveyor mechanism (not shown).

BRIEF DESCRIPTION OF THE DRAWINGS

FIGS. 1A to 1E illustrate the principle of a method according to the present invention;

FIG. 27A shows the manner in which a guide plate, located at the right side in FIG. 17, is operated;

FIG. 27B shows the manner in which a guide plate, located at the left side in FIG. 17, is operated;

DESCRIPTION OF THE PREFERRED EMBODIMENTS

The present invention will now be described, by way of example, with reference to the accompanying drawings.

FIGS. 2 to 13B illustrate a drying apparatus according to a first embodiment of the present invention.

Illustratively, the present invention is applied to a drying apparatus of the type in which pure water or a rinsing liquid is withdrawn from a rinsing bath whereas two holders for supporting substrates are fixed in place.

Figure 2:
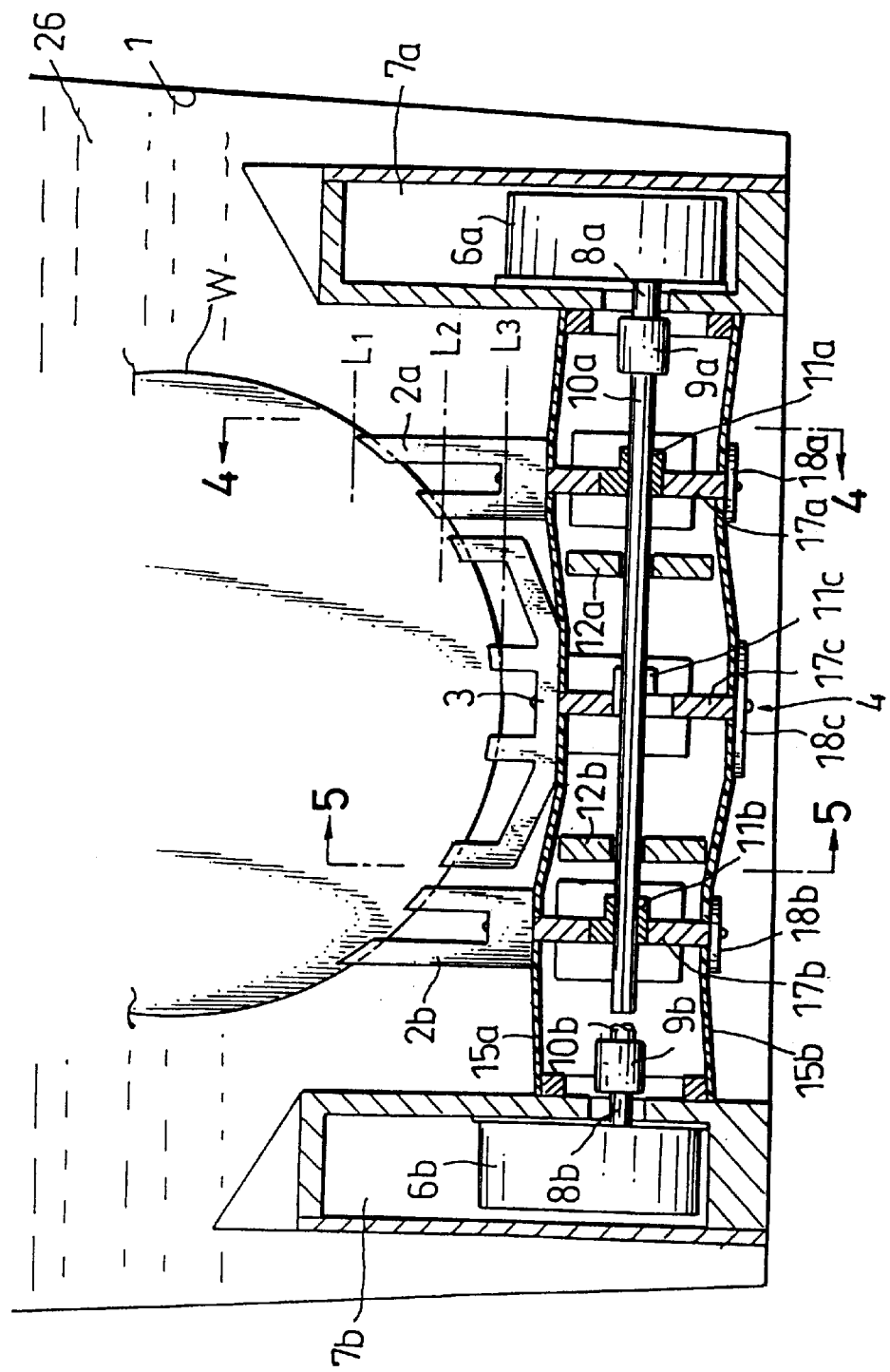
FIG. 2 is a schematic vertical sectional view of a drying apparatus according to a first embodiment of the present invention.
Figure 3:
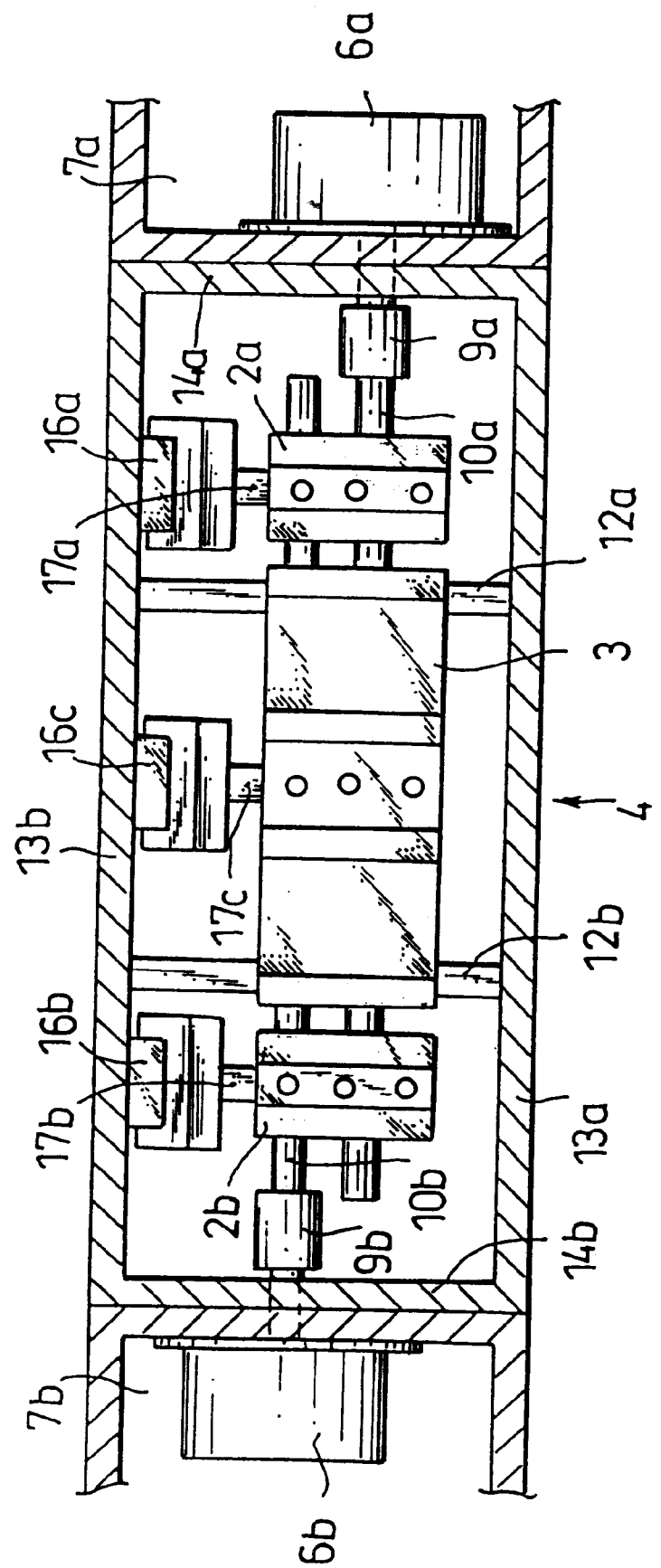
FIG. 3 is a schematic plan view of the drying apparatus shown in FIG. 2.

Referring specifically to FIGS. 2 and 3, pure water is contained in a rinsing bath 1. A holder lifting mechanism 4 is arranged in the vicinity of the 'bottom of the rinsing bath 1 so as to selectively move up and down a pair of first holders 2a and 2b and a second holder 3. A pair of actuator containers 7a and 7b are disposed at opposite sides of the holder lifting mechanism 4. A pair of pneumatically driven actuators 6a and 6b are contained within the corresponding actuator containers 7a and 7b and adapted to drive the holder lifting mechanism 4.

Although not specifically shown, the actuator containers 7a and 7b each include an air inlet for feeding air under pressure to the actuators 6a and 6b, an air outlet, and an air vent through which the interior of each of the holder lifting mechanism 4 and the actuator containers 7a and 7b is communicated with ambient atmosphere.

The first actuator 6a includes a drive shaft Ba which is connected through a coupling 9a to a first drive shaft 10a of the holder lifting mechanism 4. A pair of eccentric cams 11a and 11b are fixedly mounted on the first drive shaft 10a immediately below the corresponding first holders 2a and 2b so as to move up and down the first holders 2a and 2b, respectively.

Similarly, the second actuator 6b includes a drive shaft 8b which is connected through a coupling 9b to a second drive shaft 10b of the holder lifting mechanism 4. An eccentric cam 11c is fixedly mounted on the second drive shaft 10b immediately below the second holder 3 so as to move up and down the second holder 3.

The first drive shaft 10a and the second drive shaft 10b extend through and are held in place by two reinforcing plates 12a and 12b. The two reinforcing plates 12a and 12b thus serve as bearings as well as positioning plates.

The holder lifting mechanism 4 includes a front plate 13a, a rear plate 13b, a right side plate 14a, and a left side plate 14b. These four plates are assembled as a sealed housing. A pair of flexible sheets 15a and 15b, made for example of polytetrafluoroethylene, are sealingly attached to the upper and lower sides of the housing through gaskets (not shown). A pair of linear sliders 16a and 16b are mounted to the inner side of the rear plate 13b so as to guide vertical movement of the corresponding first holders 2a and 2b. Similarly, a linear slider 16c is mounted to the inner side of the rear plate 13b so as to guide vertical movement of the second holder 3.

Figure 4:
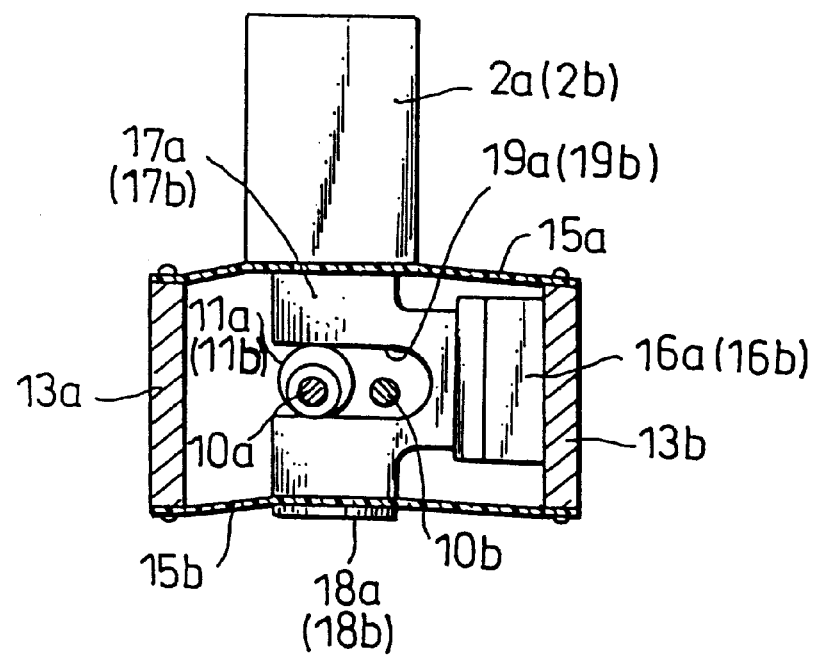
FIG. 4 is a sectional view taken along the line 44 in FIG. 2.

Three guide plates 17a to 17c are slidably mounted to the corresponding linear sliders 16a to 16c for vertical sliding movement. As shown in FIG. 4, the upper end of each of the guide plates 17a and 17b is sealingly secured to the first holders 2a and 2b through the upper flexible sheet 15a. The lower end of each of the guide plates 17a and 17b is sealingly secured to the lower flexible sheet 15b through retainer plates 18a and 18b.

The guide plates 17a and 17b include horizontal U-shaped recesses 19a and 19b within which the eccentric cams 11a and 11b fixed on the first drive shaft 10a are rotatably received, respectively.

With this arrangement, the first actuator 6a is controllably operated to rotate the first drive shaft 10a together with the eccentric cams 11a and 11b incrementally by 180°. This causes the guide plates 17a and 17b to be vertically moved by a distance corresponding to the amount of displacement of the eccentric cams 11a and 11b from the axis of rotation of the drive shaft 10a. The first holders 2a and 2b are vertically moved with the guide plates 17a and 17b.

Figure 5:
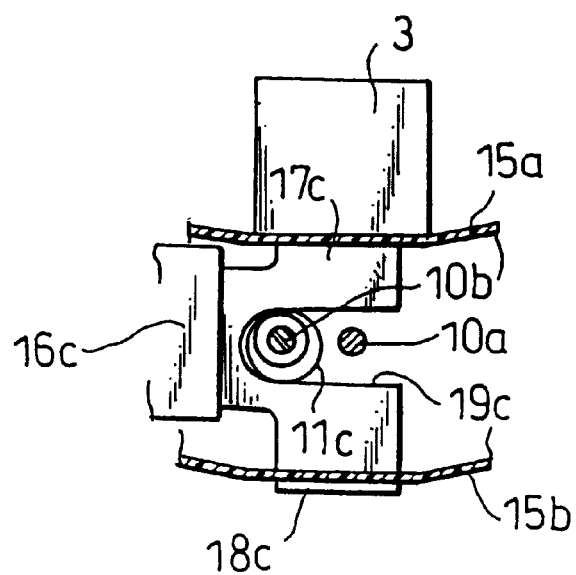
FIG. 5 is a sectional view taken along the line 55 in FIG. 2.

As shown in FIG. 5, the upper end of the guide plate 17c is sealingly secured to the second holder 3 through the upper flexible sheet 15a. The lower end of the guide plate 17c is sealingly secured to the lower flexible sheet 15b through a retainer plate 18c.

The guide plate 17c includes a horizontal U-shaped recess 19c within which the eccentric cam 11c fixed on the second drive shaft 10b is rotatably received.

With this arrangement, the second actuator 6b is controllably operated to rotate the second drive shaft 10b together with the eccentric cam 11c incrementally by 180°. This causes the guide plate 17c to be vertically moved by a distance corresponding to the amount of displacement of the eccentric cam 11c from the axis of rotation of the second drive shaft 10b. The second holder 3 is vertically moved with the second guide plate 17c.

Figure 6:
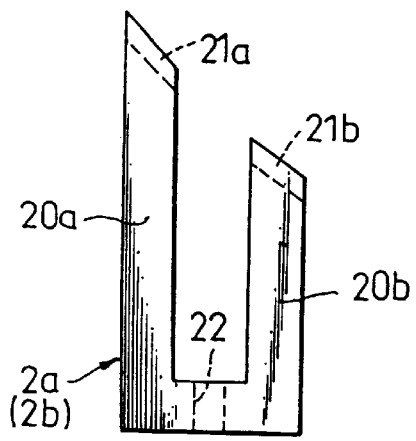
FIG. 6 is a front view of a first holder.
Figure 7:
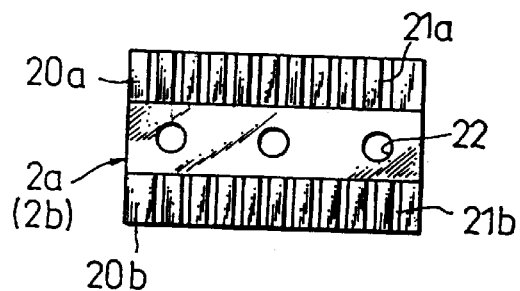
FIG. 7 is a plan view of the first holder shown in FIG. 6.
Figure 8:
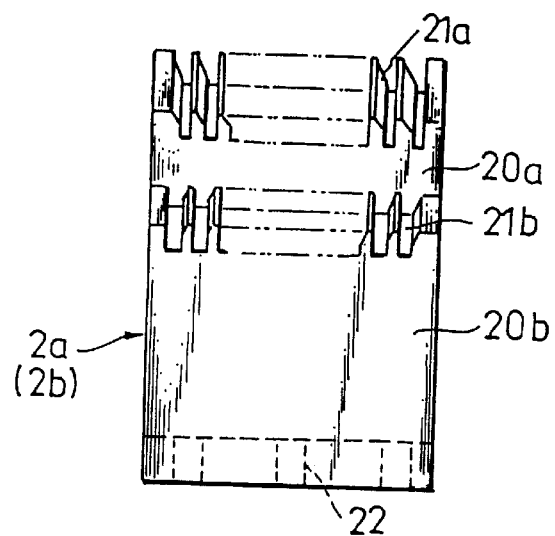
FIG. 8 is a side view of the first holder shown in FIG. 6.

Referring specifically to FIGS. 6 to 8, the first holders 2a and 2b each include two support projections or arms 20a and 20b. The length of the two support arms 20a and 20b and the space between the two support arms 20a and 20b are selected depending upon the size of a wafer W. A predetermined number of wafer holding grooves 21a and 21b are formed in the respective upper ends of the support arms 20a and 20b to receive the wafers W. The reference numeral 22 designates a bolt hole through which a bolt extends so as to secure the first holders 2a and 2b to the upper ends of the guide plates 17a and 17b, respectively.

Figure 9:
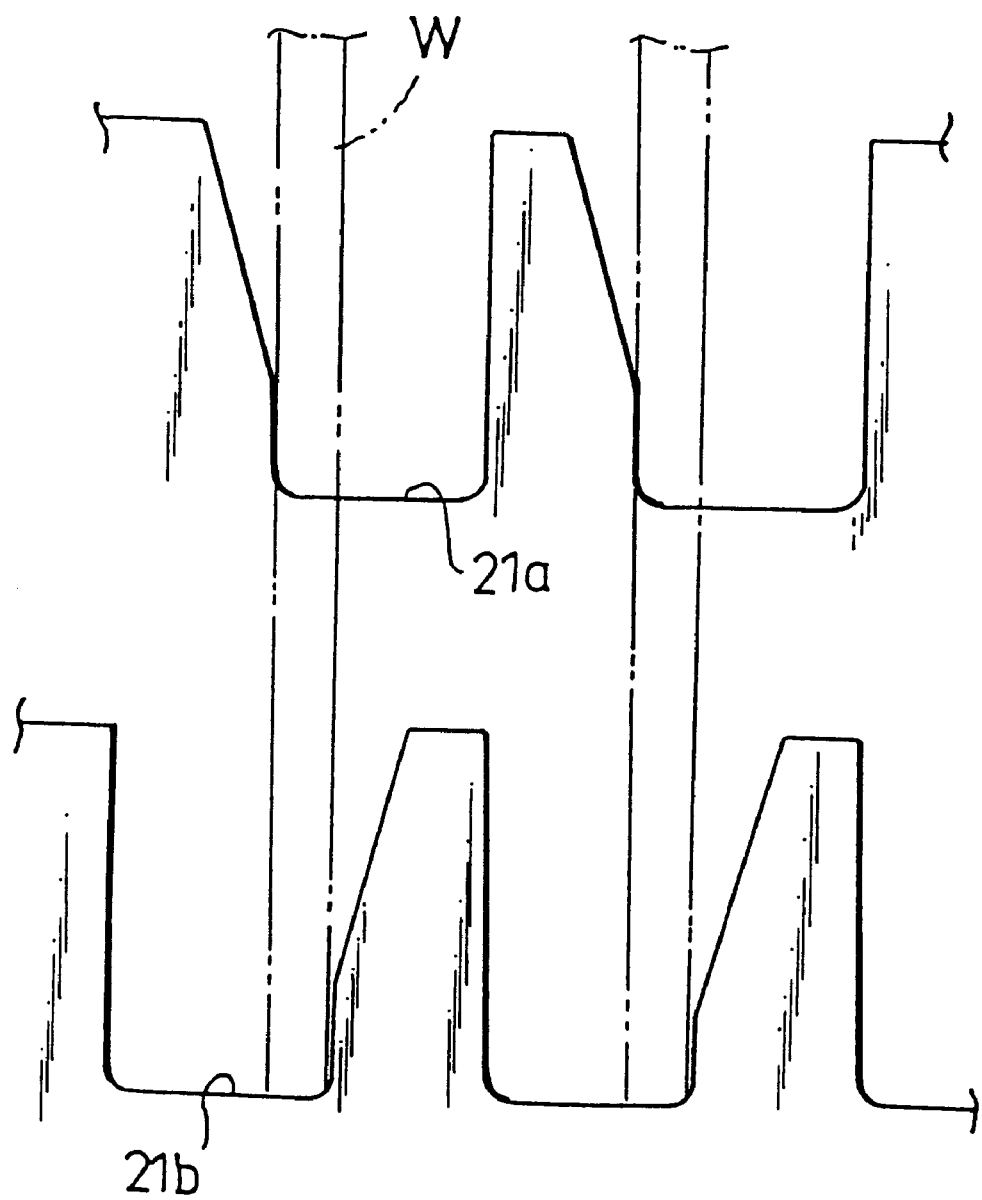
FIG. 9 is an enlarged view of a plurality of wafer holding grooves of the first holder.

As shown, on an enlarged scale, in FIG. 9, the grooves 21a and 21b each have a width significantly greater than the thickness of the wafer W. The grooves 21a and 21b have respective slant surfaces inclined in opposite directions and slightly laterally displaced so as to hold the wafer W in its vertical orientation while the wafer W is interposed between the grooves 21a and 21b.

Figure 13A:
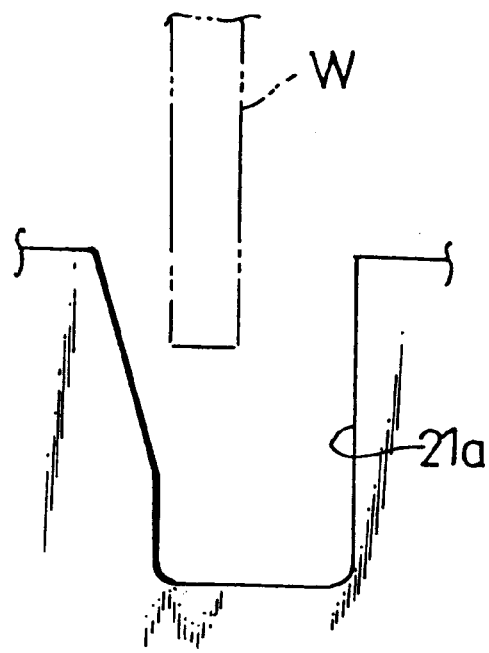
FIGS. 13A and 13B show the manner in which a wafer is separated from the grooves of the first holder.
Figure 13B:
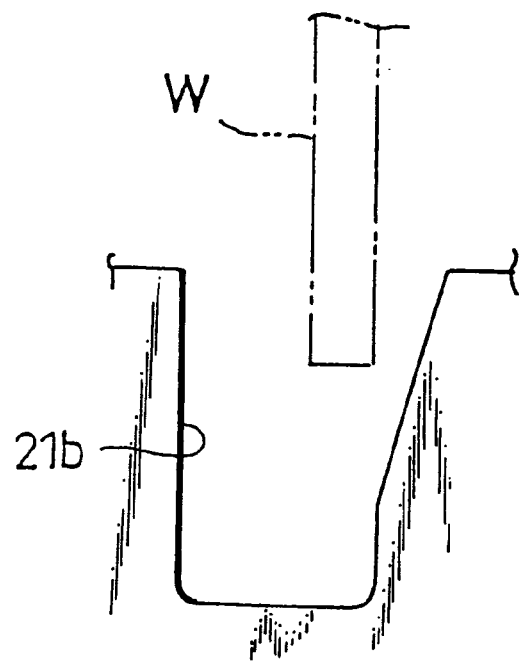

This particular shape of the grooves 21a and 21b enables tight holding of the wafer W. When the wafer W is spaced away from the grooves 21a and 21b, a sufficient space is left between the wafer W and the grooves 21a and 21b as shown in FIGS. 13A and 13B, to thereby minimize the risk that water droplets remain within the grooves 21a and 21b.

Figure 10:
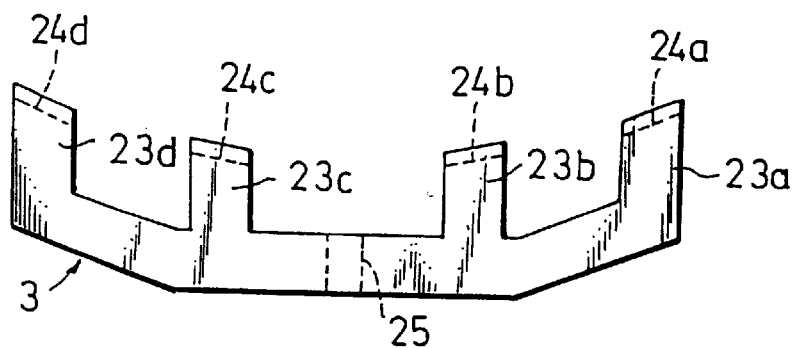
FIG. 10 is a front view of a second holder.
Figure 11:
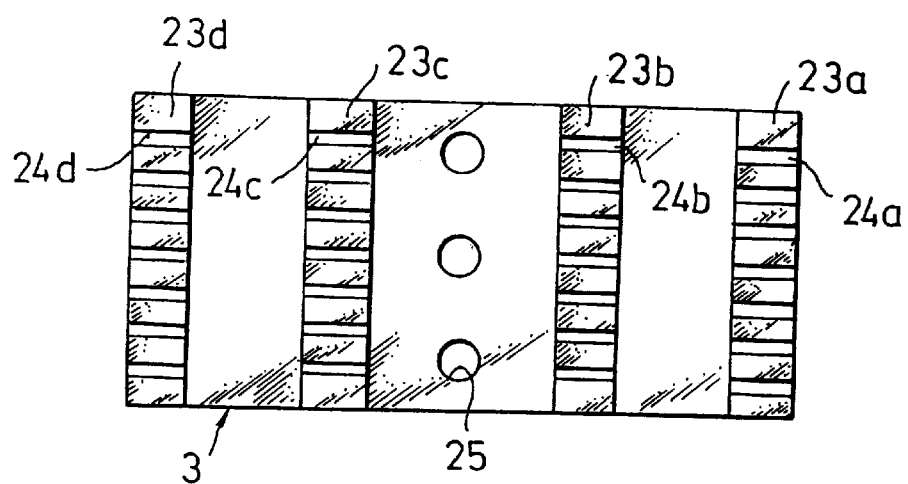
FIG. 11 is a plan view of the second holder shown in FIG. 10.
Figure 12:
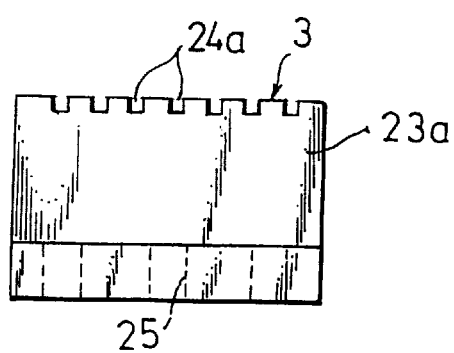
FIG. 12 is a side view of the second holder shown in FIG. 10.

As shown in FIGS. 10 to 12, the second holder 3 includes four support arms 23a to 23d. A plurality of wafer holding grooves 24a to 24d are formed in the respective upper ends of the support arms 23a to 23d and are similar in shape to the grooves 21a and 21b of the first holders 2a and 2b. The reference numeral 25 designates a bolt hole through which a bolt extends so as to secure the second holder 3 to the upper end of the guide plate 17c.

Reference will next be made to a drying process carried out by the drying apparatus.

At the initial stage of the process, the wafers W are held solely by the second holder 3, and the first holders 2a and 2b are located downwardly from the wafer W.

The wafers W are transferred to the rinsing bath 1 by means of a conveyor mechanism and a chuck (not shown) after they have been cleaned by a suitable chemical or washing agent. The wafers W are vertically placed on the second holder 3 within the rinsing bath 1. The rinsing bath 1 is covered by an upper lid (not shown). Pure water 26 is then fed from a supply of pure water (not shown) so as to rinse the surfaces of the wafers W.

After the wafers W have been rinsed, a mixture of isopropyl alcohol and nitrogen is fed from a gas resource (not shown) to the upper interior space of the rinsing bath 1. A drain valve (not shown) is then opened to withdraw the pure water from the rinsing bath 1.

The pure water may be withdrawn at the highest possible speed until the level of the water reaches the upper ends of the wafers W. After the water level reaches the upper ends of the wafers W, the drain valve should be controlled to allow the pure water to be withdrawn at a speed, for example, 1.5 cm/sec, suitable for achieving the Marangoni effect.

When the water level becomes below the tops of the wafers W, a portion of a surface of each of the wafers W above the water level is cleanly dried under the Marangoni effect as the water level is lowered along the surfaces of the wafers W. When the water level reaches the upper ends of the first holders 2a and 2b or position of the grooves 21a and 21b, as indicated at L1, the pure water will barely be left in the grooves 21a and 21b since the wafer W is spaced away from the grooves 21a and 21b (see FIGS. 13A and 13B).

As such, the wafer W and the grooves 21a and 21b can be dried in a significantly short period of time after the wafer W and the grooves 21a and 21b are located above the water level. In the prior art arrangement, a substantial number of water droplets are left at contact portions between a wafer and wafer holding grooves. Watermarks thus remain when such water droplets are dried. In the present invention, no watermark remains since water droplets are barely left between the wafer and the grooves 21a and 21b.

When the water level is further lowered to the upper end of the second holder 3 or position of the grooves 24a and 24b, as indicated at $L_2$, a controller (not shown) is operable to control the actuators 6a and 6b so as to rotate the first drive shaft 10a and the second drive shaft 10b by 180°.

As the eccentric cams 11a to 11c are rotated with the first and second drive shafts 10a and 10b, the guide plates 17a and 17b are moved up by a distance corresponding to the amount of displacement of the cams 11a and 11b from the axis of rotation, whereas the guide plate 17c is moved down by a distance corresponding to the amount of displacement of the cam 11c from the axis of rotation.

The first holders 2a and 2b are moved up with the guide plates 17a and 17b, respectively through the flexible sheet 15a. Also, the second holder 3 is moved down with the guide plate 17c through the flexible sheet 15a. When the water level reaches the upper end of the second holder 3, as indicated at $L_2$, the wafers W are separated from the grooves 24a to 24d of the second holder 3 and instead, held by the first holders 2a and 2b, i.e. the wafers W are held by the grooves 21a and 21b of the first holders 2a and 2b which grooves are dried.

When the water level is further lowered to the grooves 24a to 24b of the second holder 3, the pure water 26 will barely be left between the wafer W and the grooves 24a to 24d since the wafer W has already been disengaged from the grooves 24a to 24d as described above.

As such, the wafer W and the grooves 24a to 24d can be dried in a significantly short period of time after the wafer W and the grooves 24a to 24d are located above the water level. As stated above, in the prior art arrangement, a substantial number of water droplets are left between a wafer and wafer holding grooves. watermarks remain when such water droplets are dried. In the present invention, no watermark remains since water droplets are barely left between the wafer W and the grooves 24a to 24d.

This drying process is completed when the level of the pure water 26 is lowered below the lower ends of the wafers W, as indicated at $L_3$, or when the pure water 26 is fully discharged from the rinsing bath 1. The wafers W are thereafter moved out of the rinsing bath 1 and transferred for a next processing step by means of a chuck and a conveyor mechanism (not shown).

It should be noted that the flexible sheets 15a and 15b in their entirety are vertically moved with the first holders 2a and 2b and the second holder 3. This results in variations in the volume of the rinsing bath 1 and thus, the level of the pure water within the rinsing bath 1. To this end, in this embodiment, the first holders 2a and 2b and the second holder 3 are moved in opposite directions. That is, when the first holders 2a and 2b are raised, the second holder 3 is simultaneously lowered. When the first holders 2a and 2b are lowered, the second holder 3 is simultaneously raised. This accommodates a change in the volume of the rinsing bath 1, eliminates a corresponding change in the water level and thus, prevents the pure water from bubbling or splashing. The wafers can thus be cleaned with a higher degree of cleanability.

Figure 14:
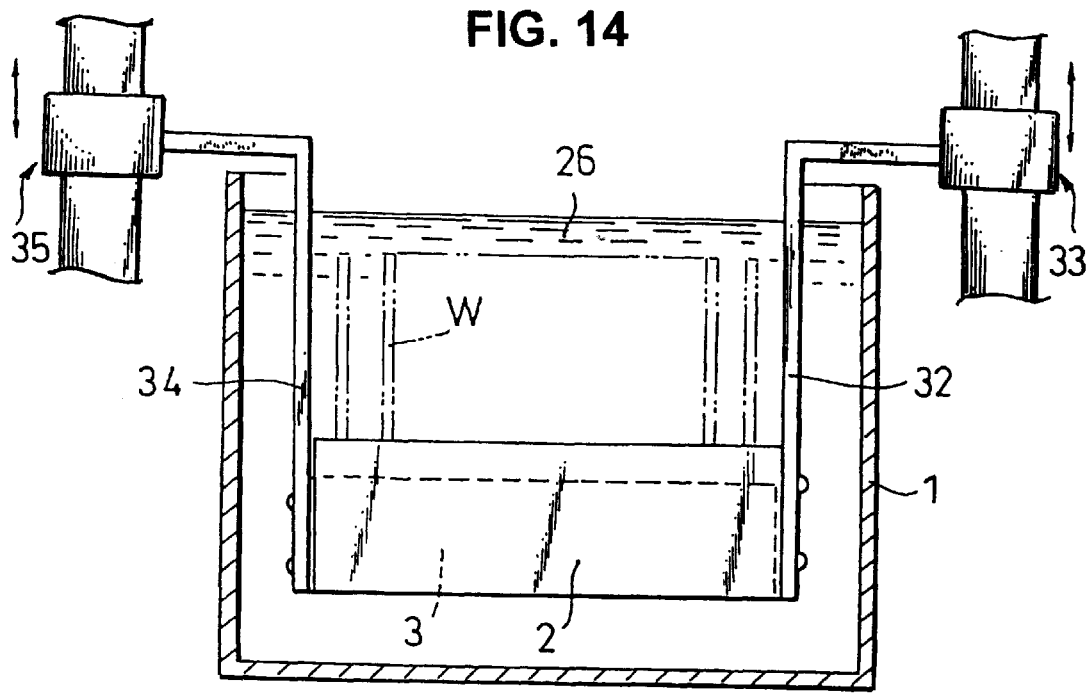
FIG. 14 is a schematic sectional view of a drying apparatus according to a second embodiment of the present invention.
Figure 15:
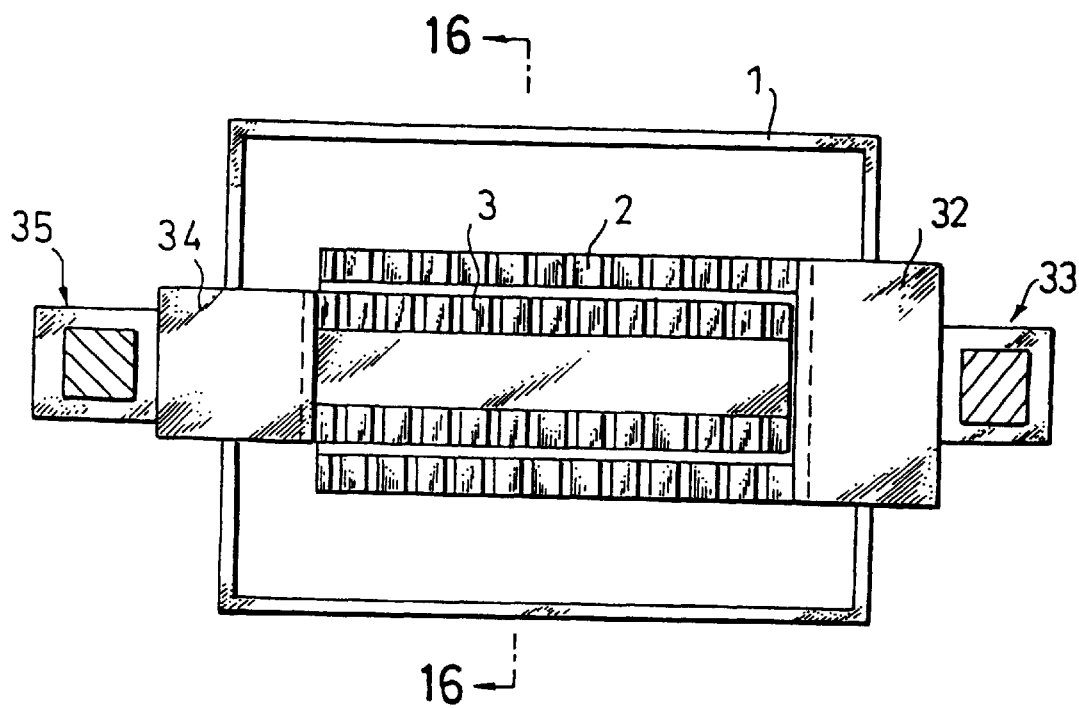
FIG. 15 is a schematic plan view of the drying apparatus shown in FIG. 14.
Figure 16:
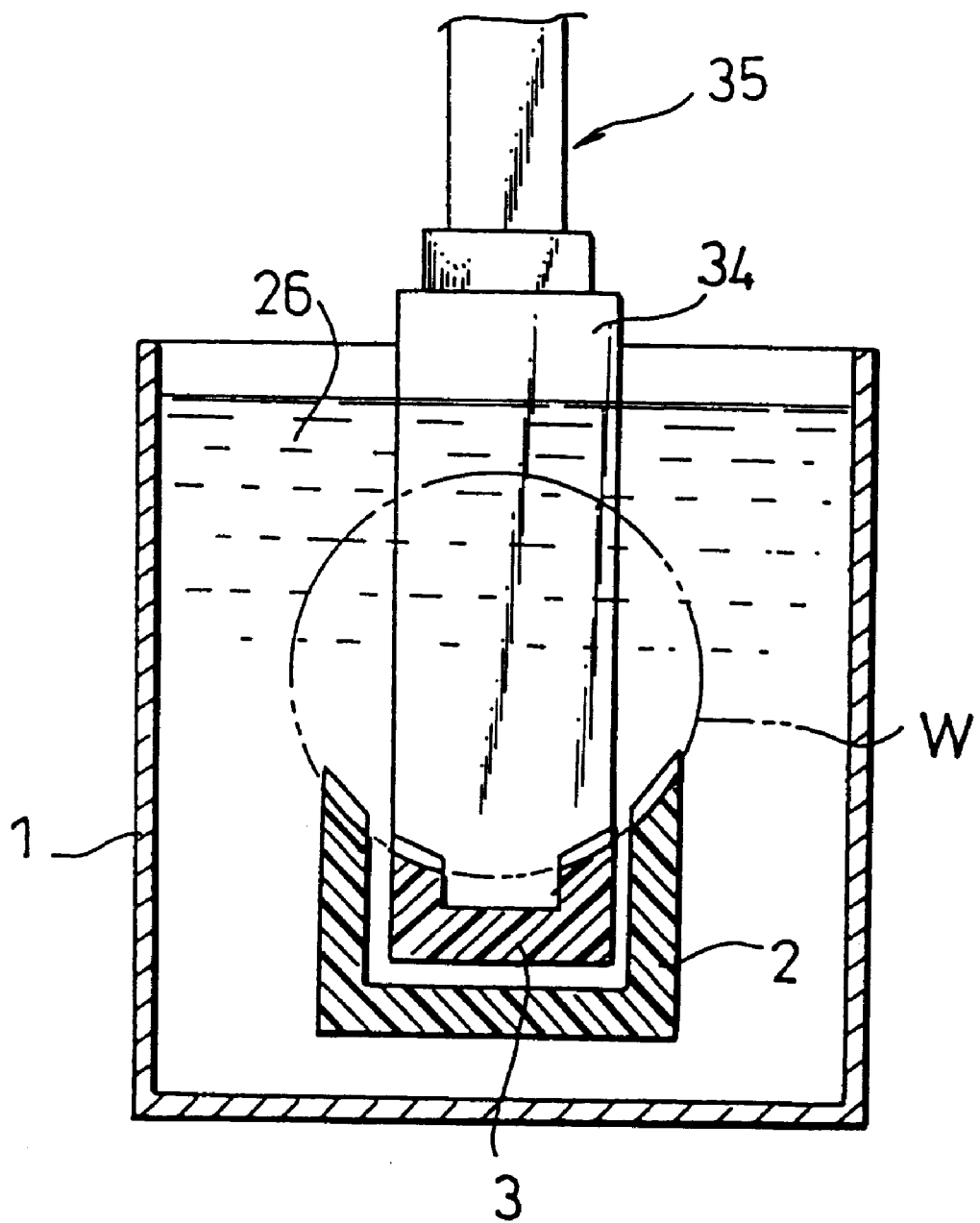
FIG. 16 is a sectional view taken along the line 16—16 in FIG. 15.

FIGS. 14 to 16 illustrate a second embodiment of the present invention.

The second embodiment includes a holder lifting mechanism which is different in structure from that used in the first embodiment.

In the second embodiment, a holder lifting mechanism includes a first linear drive mechanism 33 connected through a connecting rod 32 to a first holder 2, and a second linear drive mechanism 35 connected through a connecting rod 34 to a second holder 3. The first and second linear drive mechanisms 33 and 35 are controllably operated to vertically move the first and second holders 2 and 3, respectively.

The timing of vertical movement of the first and second holders 2 and 3 and the drying process are identical to those referred to in the first embodiment and will not be described herein.

Figure 17:
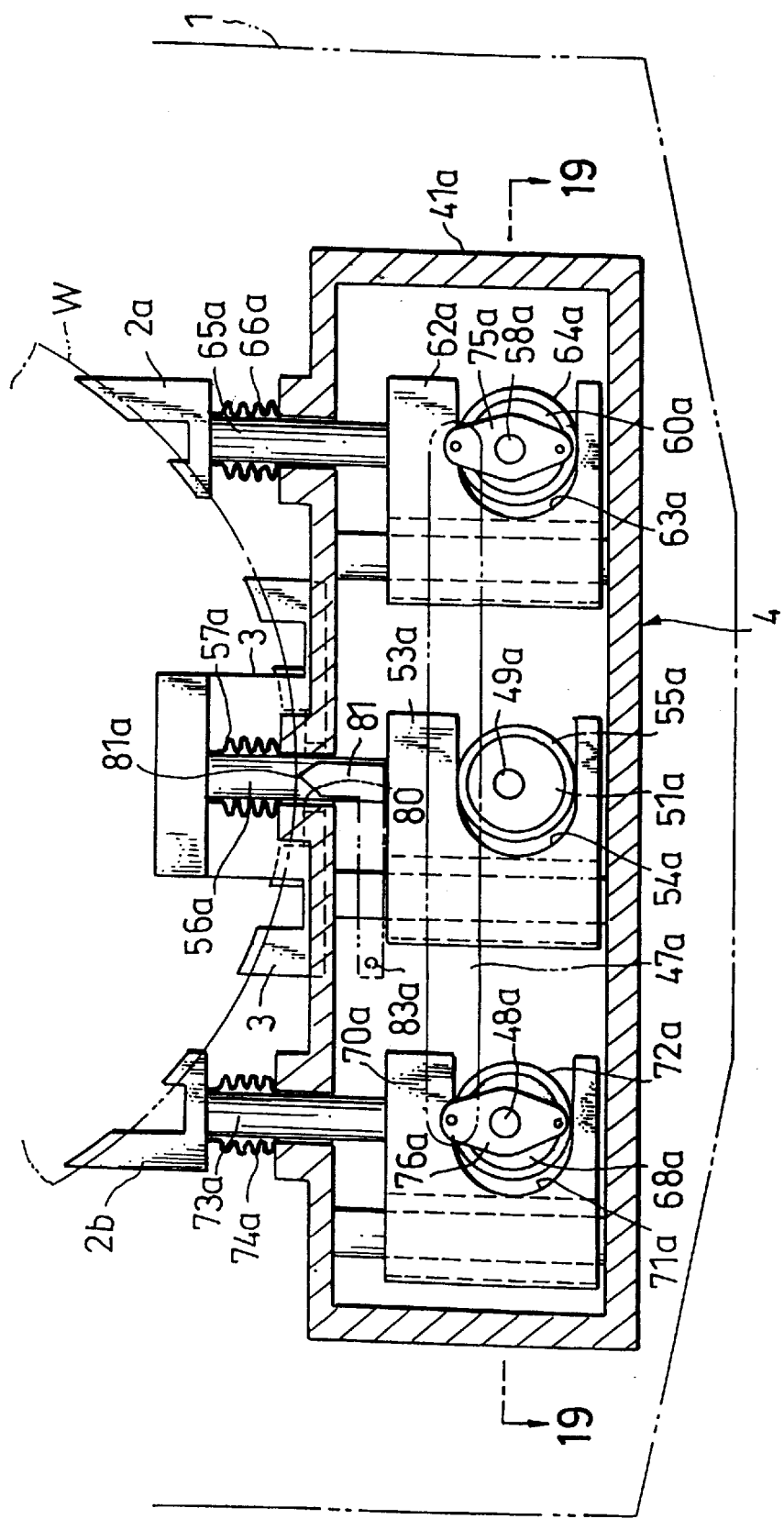
FIG. 17 is a schematic sectional view of a drying apparatus according to a third embodiment of the present invention.

FIGS. 17 to 25 illustrate a drying apparatus according to a third embodiment of the present invention. In FIG. 17, the drying apparatus is shown with an upper lid removed for clarity. Like parts are given like reference numerals used in the first embodiment.

Figure 18:
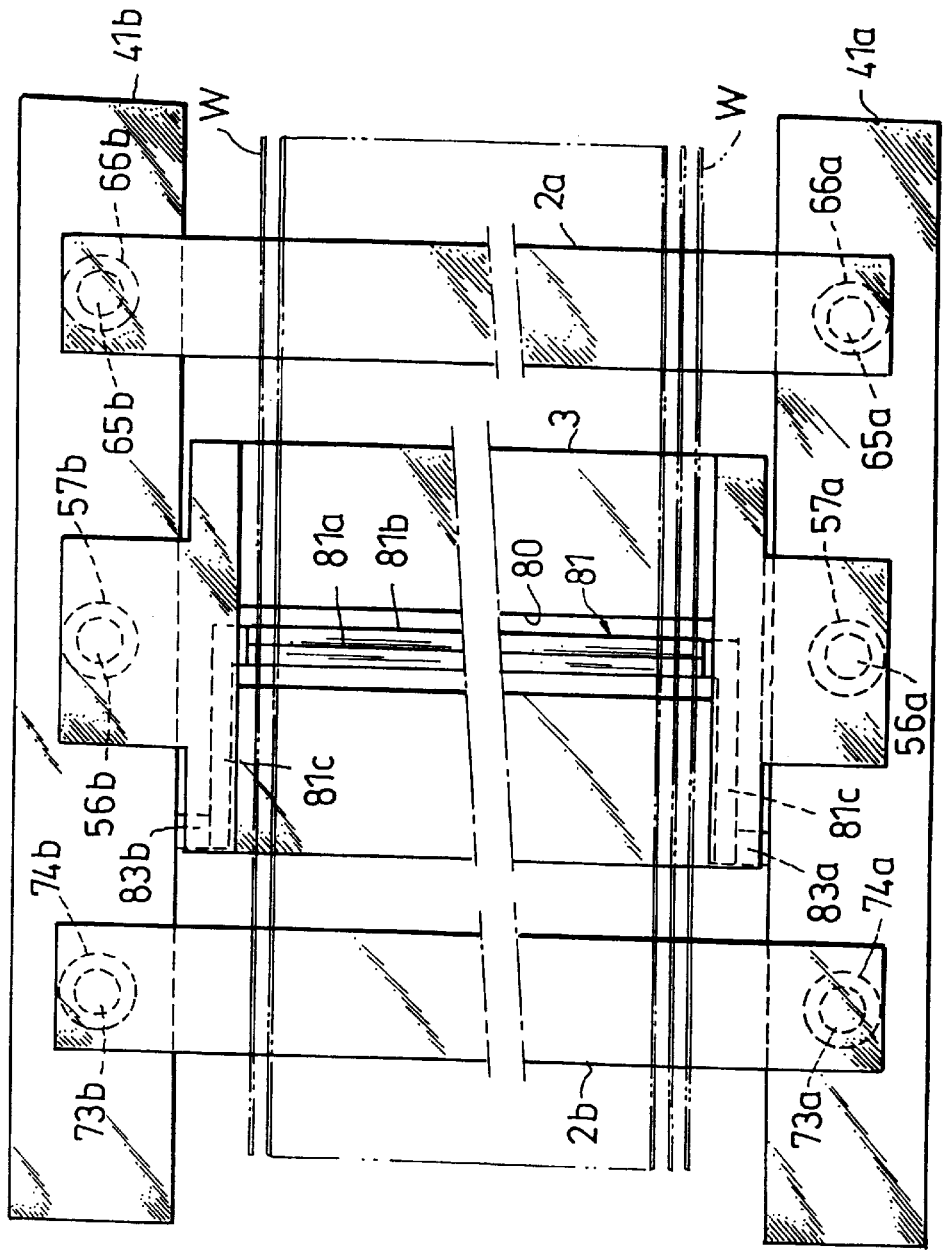
FIG. 18 is a schematic plan view of the drying apparatus shown in FIG. 17.
Figure 19:
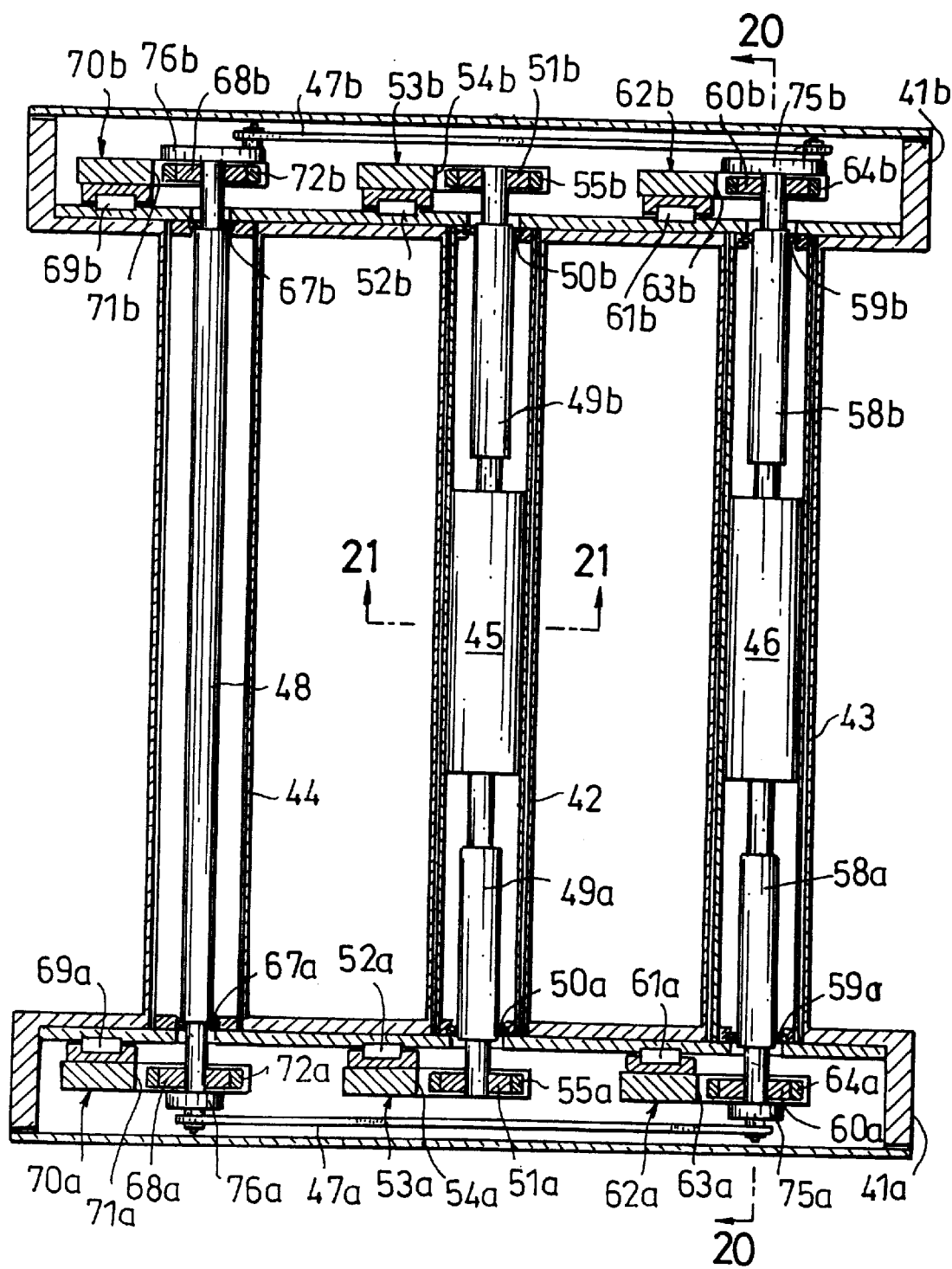
FIG. 19 is a sectional view taken along the line 19—19 in FIG. 17.
Figure 20:
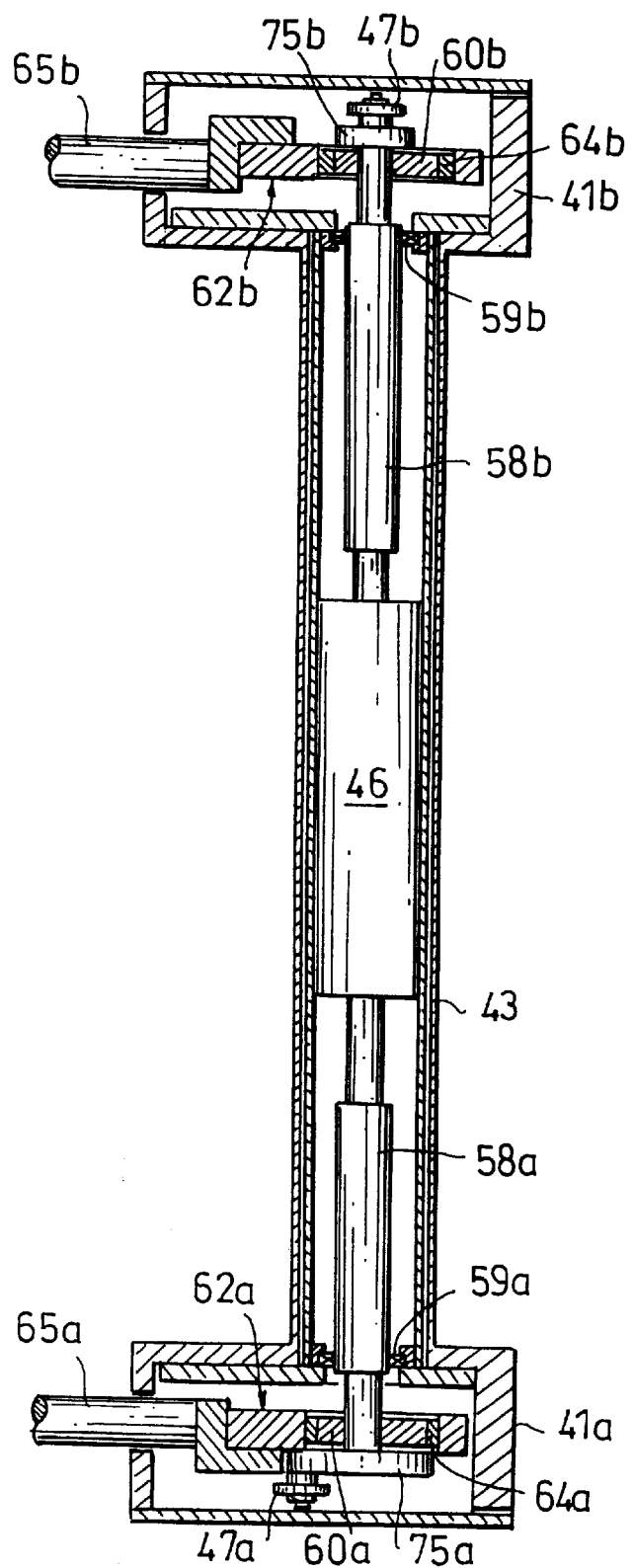
FIG. 20 is a sectional view taken along the line 20—20 in FIG. 19.
Figure 21:
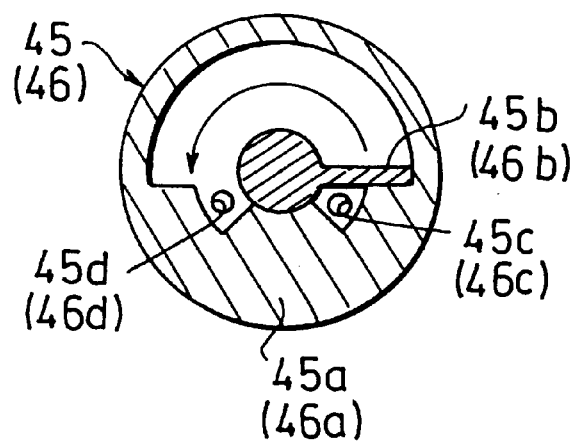
FIG. 21 is a sectional view taken along the line 21—21 in FIG. 19.

As shown in FIGS. 17 to 19, a holder lifting mechanism 4 of the third embodiment includes a pair of sealed casings 41a and 41b interconnected by three pipes 42 to 44. A suitable mechanism is arranged in the sealed casings 41a and 41b to vertically move first holders 2a and 2b and a second holder 3.

Disposed within the centrally located pipe 42 (see FIG. 19) is a first rotary actuator 45 as a drive means for vertically moving the second holder 3. As shown in schematic section in FIG. 21, the first rotary actuator 45 includes a rotor 45b rotatably mounted within a cylindrical member 45a. The cylindrical member 45a includes an air inlet 45c and an air outlet 45d. Air under pressure is selectively fed into and discharged from the first rotary actuator 45 through the air inlet 45c and the air outlet 45d so as to reversibly rotate the rotor 45b by 180°.

A second rotary actuator 46 is mounted within the pipe 43 (right side in FIG. 19) and serves as a drive means for vertically moving the first holders 2a and 2b. As in the first rotary actuator 45 shown in FIG. 21, the second rotary actuator 46 includes an air inlet 46c and an air outlet 46d. Air under pressure is fed into and discharged from the second rotary actuator 46 so as to reversibly rotate a rotor 46b by 180°.

Disposed within the pipe 44 (left side in FIG. 19) is a driven shaft 48 driven by the second rotary actuator 46 through opposite links 47a and 47b.

Two shafts 49a and 49b are connected to opposite ends of the first rotary actuator 45 within the pipe 42. As the rotor 45b is rotated by 180°, the shafts 49a and 49b are also rotated by 180° in the same direction. The shafts 49a and 49b extend into the left and right sealed casings 41a and 41b through a pair of opposite bearings 50a and 50b, respectively. A pair of eccentric cams 51a and 51b are fixedly mounted on the distal ends of the shafts 49a and 49b, respectively.

A pair of guide plates 53a and 53b are vertically moved along a corresponding pair of linear sliders 52a and 52b and include respective horizontal U-shaped recesses 54a and 54b within which the eccentric cams 51a and 51b are respectively received. The guide plates 53a and 53b are designed to convert rotary movement into vertical movement. When the eccentric cams 51a and 51b are rotated by 180°, the guide plates 53a and 53b are vertically moved by a distance corresponding to the offset amount of the eccentric cams 51a and 51b. To minimize frictional resistance between the eccentric cams 51a and 51b and the recesses 54a and 54b, a pair of bearings 55a and 55b are fitted around the two eccentric cams 51a and 51b, respectively.

To vertically move the second holder 3, a pair of drive shafts 56a and 56b each have one end thereof connected to the upper surface of a corresponding one of the guide plates 53a and 53b and the other end thereof connected to the second holder 3. The drive shafts 56a and 56b extend into the rinsing bath 1 through the tops of the sealed casings 41a and 41b. A pair of bellows 57a and 57b are disposed around the corresponding drive shafts 56a and 56b so as to prevent entry of the pure water into the sealed casings 41a and 41b. The drive shafts 56a and 56b are freely moved up and down through the bellows 57a and 57b.

Two shafts 58a and 58b are connected to opposite ends of the second rotary actuator 46 within the pipe 43. As the rotor 46b is rotated by 180°, the shafts 58a and 58b are also rotated by 180° in the same direction. The shafts 58a and 58b extend into the left and right sealed casings 41a and 41b through a pair of bearings 59a and 59b, respectively. A pair of eccentric cams 60a and 60b are fixedly mounted on the distal ends of the shafts 58a and 58b, respectively.

A pair of guide plates 62a and 62b are vertically moved along a corresponding pair of linear sliders 61a and 61b and include respective horizontal U-shaped recesses 62a and 62b within which the eccentric cams 60a and 60b are respectively received. The guide plates 62a and 62b are designed to convert rotary movement into vertical movement. When the eccentric cams 60a and 60b are rotated by 180°, the guide plates 62a and 62b are vertically moved by a distance corresponding to the offset amount of the eccentric cams 60a and 60b. To minimize frictional resistance between the eccentric cams 60a and 60b and the recesses 63a and 63b, a pair of bearings 64a and 64b are fitted around the two eccentric cams 60a and 60b, respectively.

To vertically move the first holder 2a, a pair of drive shafts 65a and 65b each have one end thereof connected to the upper surface of a corresponding one of the guide plates 62a and 62b and the other end thereof connected to the first holders 2a. The drive shafts 65a and 65b extend into the rinsing bath 1 through the tops of the sealed casings 41a and 41b. A pair of bellows 66a and 66b are disposed around the corresponding drive shafts 65a and 65b so as to prevent entry of the pure water into the sealed casings 41a and 41b. The drive shafts 65a and 65b are freely moved up and down through the bellows 66a and 66b.

The driven shaft 48 is received within the pipe 44. The driven shaft 48 extends into the sealed casing 41a and 41b.

The links 47a and 47b are connected to opposite ends of the driven shaft 48. The driven shaft 48 is driven by the second rotary actuator 46 through the links 47a and 47b. The eccentric cams 68a and 68b are fixedly mounted on the opposite ends of the driven shaft 48.

A pair of guide plates 70a and 70b are vertically moved along a corresponding pair of linear sliders 69a and 69b and include respective horizontal U-shaped recesses 71a and 71b within which the eccentric cams 68a and 68b are respectively received. The guide plates 70a and 70b are designed to convert rotary movement into vertical movement. When the eccentric cams 68a and 68b are rotated by 180°, the guide plates 70a and 70b are vertically moved by a distance corresponding to the offset amount of the eccentric cams 68a and 68b. To minimize frictional resistance between the eccentric cams 68a and 68b and the recesses 71a and 71b, a pair of bearings 72a and 72b are fitted around the two eccentric cams 68a and 68b, respectively.

To vertically move the first holder 2b, a pair of drive shafts 73a and 73b each have one end thereof connected to the upper surface of a corresponding one of the guide plates 70a and 70b and the other end thereof connected to the first holder 2b. The drive shafts 73a and 73b extend into the rinsing bath 1 through the tops of the sealed casings 41a and 41b. A pair of bellows 74a and 74b are disposed around the corresponding drive shafts 73a and 73b so as to prevent entry of the pure water into the sealed casings 41a and 41b. The drive shafts 73a and 73b are freely moved up and down through the bellows 74a and 74b.

Figure 22:
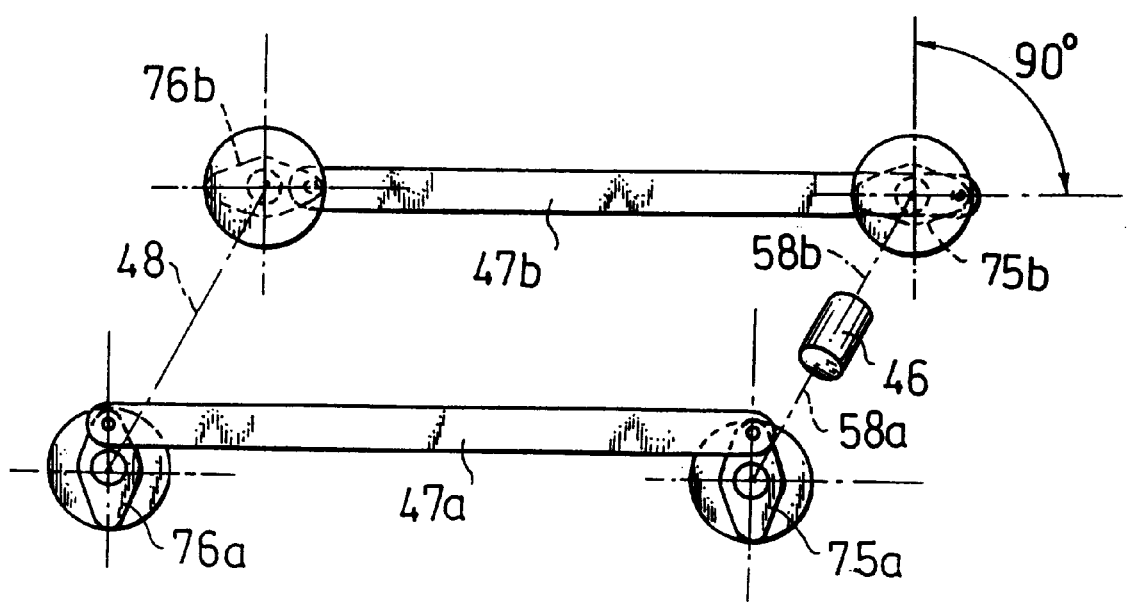
FIG. 22 is a perspective view showing the manner in which a link mechanism is connected.

As shown in FIG. 22, the links 47a and 47b each have one end thereof connected to a corresponding one of the shafts 58a and 58b through a respective one of levers 75a and 75b and the other end thereof connected to the driven shaft 48 through a respective one of opposite levers 76a and 76b. The levers 75a and 76a and the levers 75b and 76b are displaced from each other by 90° so as to promote smooth reciprocating movement of the links 47a and 47b.

The first holders 2a and 2b and the second holder 3 used in the third embodiment are basically similar in structure to those used in the first embodiment, but the following attempts are made to the second holder 3 used in the third embodiment.

Figure 23A:
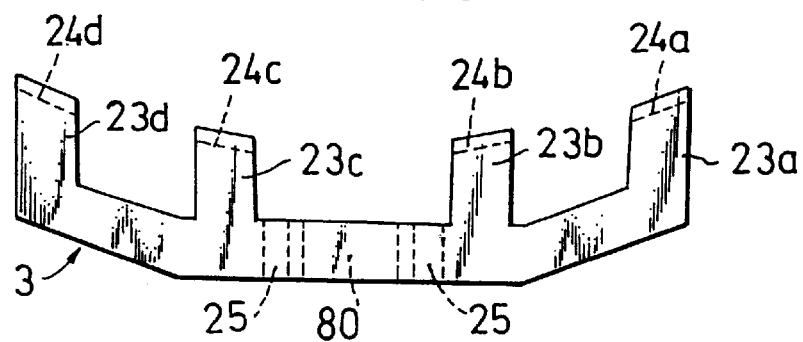
FIGS. 23A and 23B are side and plan views of a second holder.
Figure 23B:
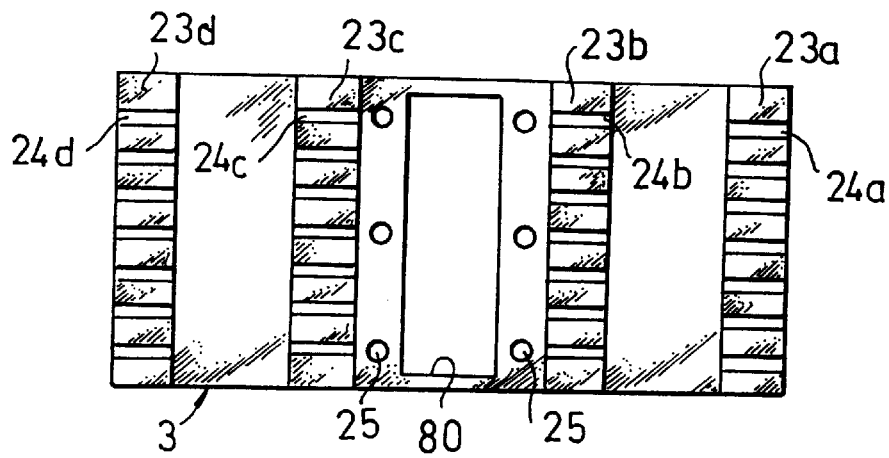
Figure 24:
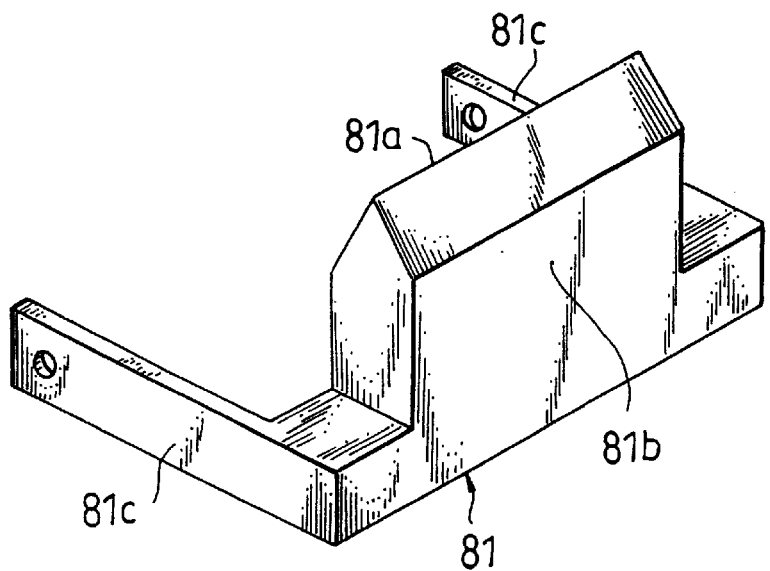
FIG. 24 is a perspective view of a floating member.

Referring specifically to FIGS. 23A and 23B, the second holder 3 includes a central opening 80 to receive a floating member 81.

The floating member 81 includes a floating body 81b with a triangular edged top 81a, and a pair of side arms 81c extending horizontally from opposite sides of the floating body 81b. The floating body 81b is much hydrophilic to the pure water than the wafer W. The floating body 81b is made of synthetic resin having a specific gravity less than that of the pure water. Alternatively, the floating body 81b may be made of metal. In such a case, however, the floating body 81b should be hollow so that it may float on the surface of the pure water. In this instance, the floating body 81b is made of, for example, polyetherethrketone (PEEK).

Figure 25:
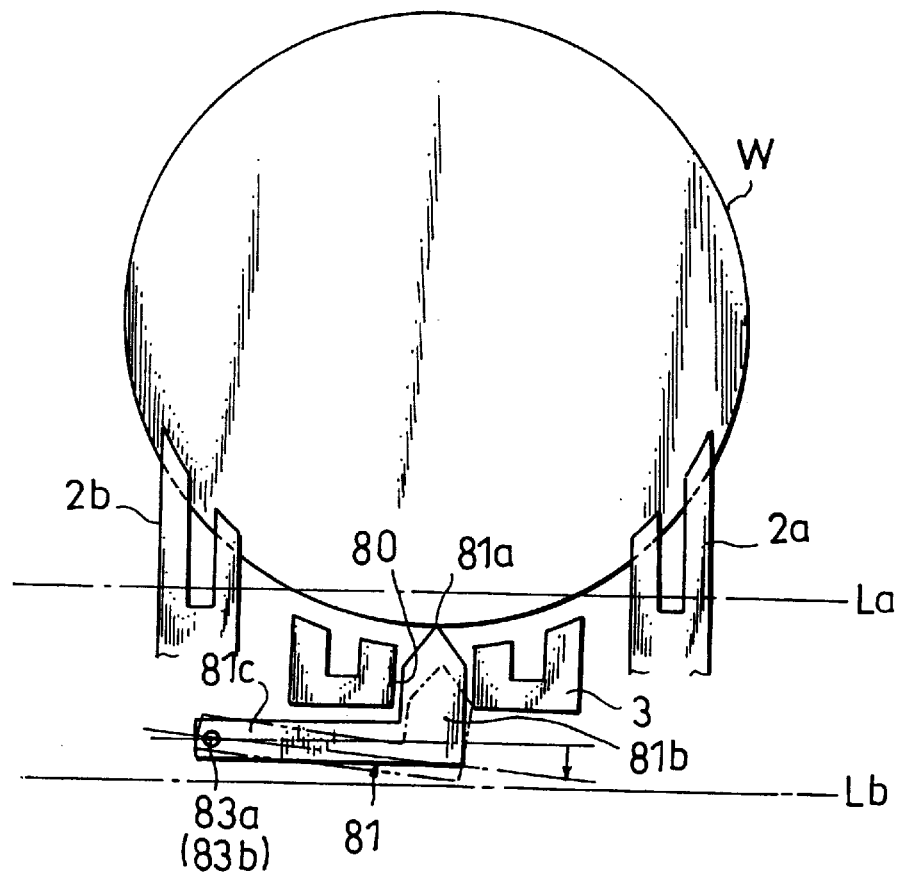
FIG. 25 shows the manner in which the floating member is operated.

As shown in FIGS. 17 and 18, the side arms 81c and 81c of the floating member 81 are pivotally mounted at their one ends to the side wall of the sealed casings 41a and 41b through pins 83a and 83b, respectively. As shown in FIG. 25, when a level La of the pure water is located above the floating member 81, the floating body 81b is upwardly pivoted about the pins 83a and 83b by buoyancy thereof, as shown by solid line, to cause the-edged top 81a of the floating body 81b to make contact with the lower end of the wafer W.

On the other hand, when the level Lb of the pure water is located below the floating member 81, the floating body 81b is downwardly pivoted by its weight, as shown by phantom line, to cause the edged top 81a to moved away from the lower end of the wafer W. This arrangement enables the edged top 81a of the floating body 81b to make water droplets, which may, otherwise, remain on the lower end of the wafer W, flow away therefrom when the level of the pure water passes past the lower end of the wafer W, resulting in no water droplet remaining on the lower edge of the wafer W.

Reference will now be made to the process carried out by the drying apparatus according to the third embodiment.

Figure 26:
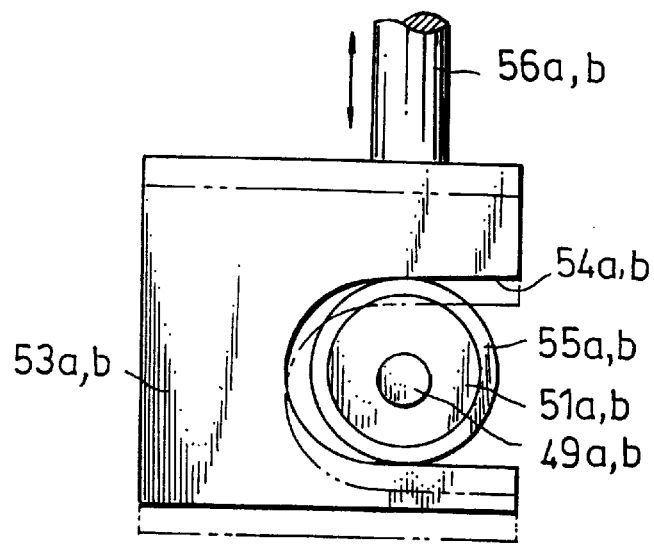
FIG. 26 shows the manner in which a guide plate, centrally located in FIG. 17, is operated.
Figure 28:
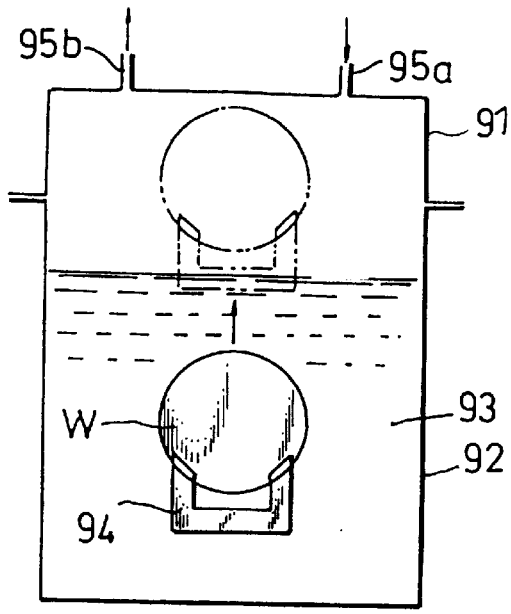
FIG. 28 illustrates one example of a drying process known in the art.
Figure 29:
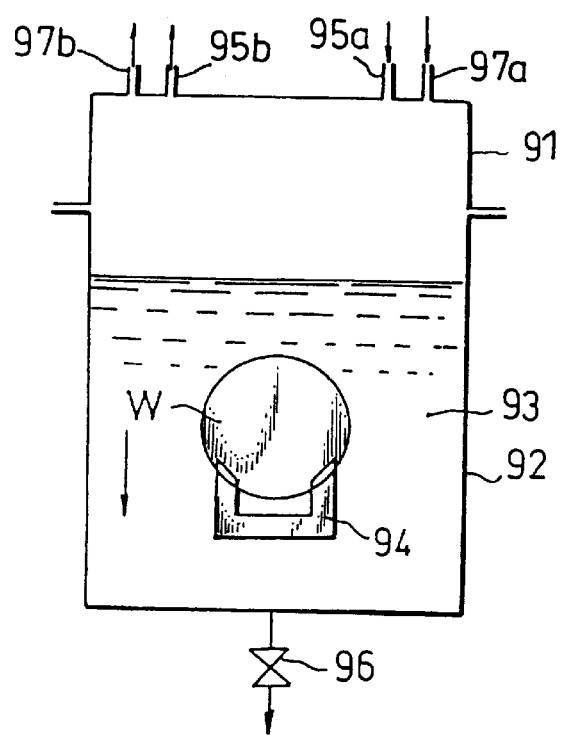
FIG. 29 illustrates another example of a drying process known in the art.
Figure 30:
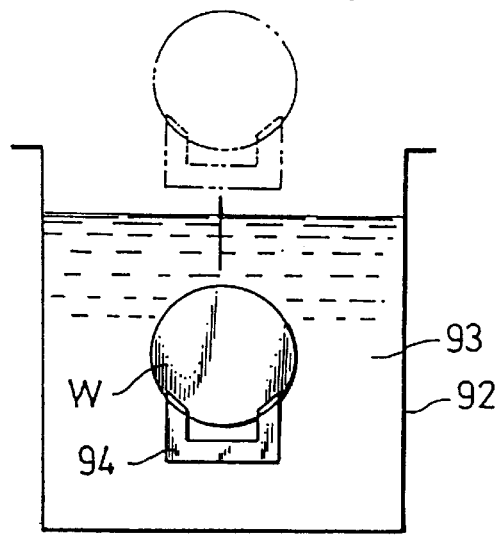
FIG. 30 illustrates a further example of a drying process known in the art.
Figure 31A:
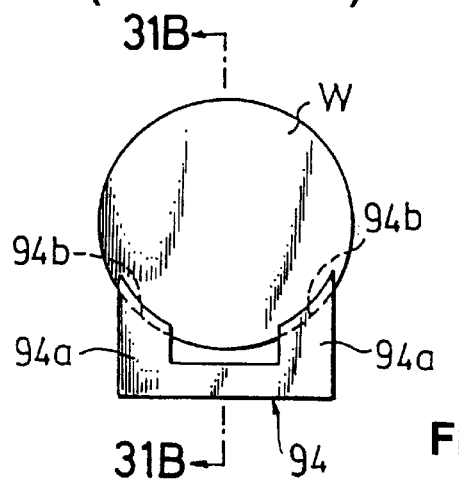
FIG. 31A is a front view of a holder used in the prior art.
Figure 31B:
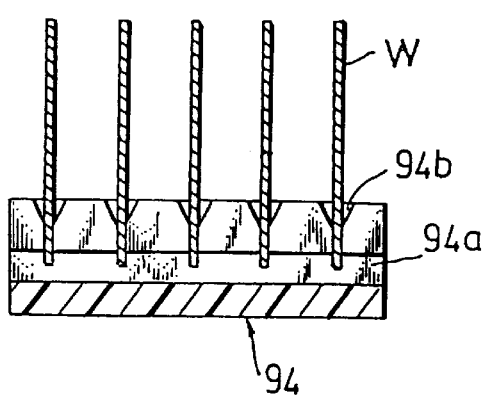
FIG. 31B is a sectional view taken along the line 31B—31B in FIG. 31A.
Figure 32:
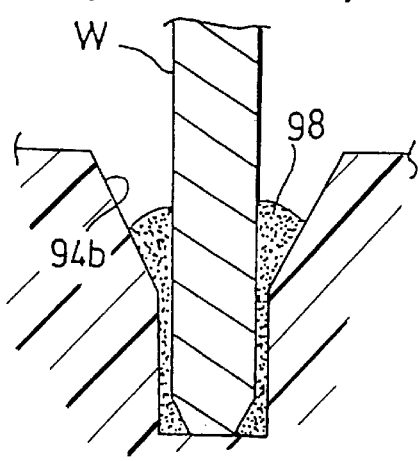
FIG. 32 shows the manner in which a wafer is engaged with wafer holding grooves of the holder.

At the initial stage of the process, all of the guide plates 53a, 53b, 60a, 60b, 70a and 70b are located in their uppermost position as shown by solid line in FIGS. 26, 27A and 27B, and the wafer W is held by all of the first holders 2a and 2b and the second holder 3.

After the wafers W have been cleaned by a suitable chemical agent, the wafers W are transferred to the interior of the rinsing bath 1 by means of a conveyor mechanism and a chuck (not shown). The wafers W are then vertically placed on the first holders 2a and 2b and the second holder 3. After the open top of the rinsing bath 1 is closed by an upper lid (not shown), the pure water is introduced from a supply of pure water (not shown) so as to rinse the surfaces of the wafers W.

After the wafers W have been rinsed out, a gas mixture of isopropyl alcohol vapor and nitrogen is fed from a gas resource (not shown) to the upper interior space of the rinsing bath 1, and a drain valve (not shown) is opened to withdraw the pure water from the rinsing bath 1 at a predetermined speed. When the level of the pure water is lowered and then, passes past the surfaces of the wafers W, the wafers are efficiently dried under the Marangoni effect as described above.

When the level of the pure water is lowered to near the upper ends of the first holders 2a and 2b, the second rotary actuator 46 is driven to rotate the rotor 46b by 180°. This causes the shafts 58a and 58b to be rotated by 180° in the same direction.

The eccentric cams 60a and 60b are rotated with the shafts 58a and 58b by 180° as shown by phantom line in FIG. 27A to thereby move the guide plates 62a and 62b from a position shown by solid line to the lowermost position shown by phantom line. As a result, the first holder 2a connected to the end of the drive shafts 65a and 65b is lowered to the lowermost position and separated from the wafers W (see FIGS. 13A and 13B).

The rotation of the shafts 58a and 58b is transmitted to the driven shaft 48 through the links 47a and 47b, whereby the driven shaft 48 is rotated by 180° in the same direction simultaneously with the rotor 46b. The eccentric cams 68a and 68b are rotated with the driven shaft 48 by 180° as shown by phantom line in FIG. 27B to thereby move the guide plates 70a and 70b to the lowermost position shown by phantom line. As a result, the first holder 2b connected to the end of the drive shafts 73a and 73b is also lowered to the lowermost position and separated from the wafers W (see FIGS. 13A and 13B).

The wafers W are then held only by the second holder 3. As described above, the links 47a and 47b are mounted to the shafts 58a and 58b and the driven shaft 48 with the levers 75a and 76a and the levers 75b and 76b while being displaced from each other by 90°. Thus, the links 47a and 47b can be smoothly rotated at this time.

When the level of the pure water is lowered to the grooves 21a and 21b of the first holders 2a and 2b (see FIGS. 6 to 8), the pure water will in no way remain in the grooves 21a and 21b since each of the wafers W has already been separated from the grooves 21a and 21b.

As such, the wafers W and the grooves 21a and 21b can be dried in a significantly short period of time, and no watermark will be left on the surfaces of the wafers W.

When the level of the pure water is further lowered to near the upper end of the second holder 3, the second rotary actuator 46 is rotated by 180° and returned to its initial position. This causes the guide plates 62a, 62b, 70a and 70b to be returned to their uppermost position as shown by solid line in FIGS. 27A and 27B. At the same time, the first rotary actuator 45 is driven to rotate the rotor 45b by 180°. This causes the shafts 49a and 49b to be rotated by 180° in the same direction.

Also, the eccentric cams 51a and 51b are rotated with the shafts 49a and 49b so as to move the guide plates 53a and 53b to their lowermost position as shown by phantom line in FIG. 26. This movement causes the second holder 3 to be moved to its lowermost position and separated from the wafers W.

Under the circumstances, the wafers W are held only by the first holders 2a and 2b rather than the second holder 3.

Although the second holder 3 is separated from the wafers W, the floating body 81b of the floating member 81 is upwardly pivoted about the pins 83a and 83b by its buoyancy to allow the edged top 81a to be in contact with the lower ends of the wafers W, as shown in FIG. 25.

By this arrangement, the pure water will in no way remain in the grooves 24a to 24d, as opposed to the prior arrangementi when the level of the pure water passes past the grooves 24a to 24d of the second holder 3 (see FIG. 10). This is because the grooves 24a to 24d have already been separated from the wafers W.

When the level of the pure water is moved downwardly to leave the lowermost ends of the wafers W, the last water droplet attached to the lower end of each of the wafers W is caused to flow away along the edged top 81a of the floating body 81b and is, then, directed to the pure water. In this way, substantially all of the water droplets can be removed from the lower ends of the wafers W.

Accordingly, the surface of the wafer W and the grooves 24a to 24d will be dried in a significantly short period of time.

This drying process is completed when the level of the pure water is moved below the lower ends of the wafers W or when the pure water is completely withdrawn from the rinsing bath 1. After this process is carried out, the wafers W are transferred for a next step by means of the chuck and the conveyor mechanism.

In the third embodiment, the sealed casings 41a and 41b are connected by the three pipes 42 to 44 only, and no such obstacle as the flexible sheets 15a and 15b used in the first embodiment (see FIG. 2) exist between the bottom of the rinsing bath 1 and the wafers W. This advantageous arrangement promotes rinsing of the wafers.

It should be understood that the floating member 81 may be employed in the first and second embodiments.

In all of the three embodiments, the pure water is used as a rinsing liquid. However, the present invention is not limited thereto. A wide variety of rinsing liquids may be used depending upon the types of wafers and rinsing requirements.

Also, the semiconductor wafer is used as a substrate to be rinsed and dried. However, the present invention is not limited thereto. For example, there may be employed a liquid crystal display glass or other disks.

Illustratively, the present invention is applied to a direct displacement IPA drying apparatus. However, the present invention is not limited thereto. The present invention is equally applicable to any types of drying apparatus in which a substrate is dried by moving the substrate out of a rinsing liquid or discharging the rinsing liquid after the substrate is immersed in the rinsing liquid while being held in a vertical orientation by holders.

The present invention has been described with respect to its preferred embodiments. It is to be understood, however, that various modifications and changes may be made without departing from the scope of the appended claims.

What is claimed is:

1. A method for drying a substrate by displacing the substrate relative to a rinsing liquid after the substrate is rinsed in a rinsing bath in which the rinsing liquid is contained, comprising the steps of:

providing a first holder vertically movably arranged in the rinsing bath and including at least one substrate holding groove, and a second holder vertically movably arranged in the rinsing bath below said first holder and including at least one substrate holding groove;

substantially vertically holding the substrate solely by said second holder, with the substrate engaged with said substrate holding groove of said second holder, when a level of the rinsing liquid passes past said substrate holding groove of said first holder; and after the level of the rinsing liquid has passed said substrate holding groove of said first holder, raising said first holder to bring said substrate holding groove thereof into engagement with the substrate and lowering said second holder to disengage said substrate holding groove of said second holder from the substrate, to thereby substantially vertically hold the substrate solely by said first holder, with the substrate engaged with said substrate holding groove of said first holder, when the level of the rinsing liquid downwardly passes past said substrate holding groove of said second holder.

2. The method as defined in claim 1, wherein after the level of the rinsing liquid has passed past said substrate holding groove of said first holder, said substrate holding groove of said first holder is dried and then brought into contact with the substrate.

3. The method as defined in claim 1, wherein said first holder and second holder are vertically moved synchronously in opposite directions so that one of said first and second holders is raised, and the other holder is lowered.

4. The method as defined in claim 2, wherein said first holder and second holder are vertically moved synchronously in opposite directions so that one of said first and second holders is raised, and the other holder is lowered.

5. The method as defined in claim 1, wherein when the level of the rinsing liquid passes a lower end of the substrate, the lower end of the substrate is kept in contact with a triangular edged member to make a portion of the rinsing liquid remaining on the lower end of the substrate flow away therefrom.

6. The method as defined in claim 2, wherein when the level of the rinsing liquid passes a lower end of the substrate, the lower end of the substrate is kept in contact with a triangular edged member to make a portion of the rinsing liquid remaining on the lower end of the substrate flow away therefrom.

7. The method as defined in claim 3, wherein when the level of the rinsing liquid passes a lower end of the substrate, the lower end of the substrate is kept in contact with a triangular edged member to make a portion of the rinsing liquid remaining on the lower end of the substrate flow away therefrom.

8. The method as defined in claim 4, wherein when the level of the rinsing liquid passes a lower end of the substrate, the lower end of the substrate is kept in contact with a triangular edged member to make a portion of the rinsing liquid remaining on the lower end of the substrate flow away therefrom.

* * * * *

UNITED STATES PATENT AND TRADEMARK OFFICE
CERTIFICATE OF CORRECTION

PATENT NO.   : 6,325,865 B2
DATED        : December 4, 2001
INVENTOR(S)  : Tadayasu Ohsawa and Hiromitsu Kurauchi It is certified that error appears in the above-identified patent and that said Letters Patent is hereby corrected as shown below:

<u>Title page,</u>
Item [57], ABSTRACT,
Line 1, after "method" insert -- and apparatus --.

<u>Column 1,</u>
Line 31, "when" should read -- When --.

<u>Column 7,</u>
Line 7, delete the apostrophe before "bottom".
Line 16, "include" should read -- includes --.

<u>Column 9,</u>
Line 62, "watermarks" should read -- Watermarks --.

<u>Column 11,</u>
Line 29, delete "are" and insert therefor -- is --.
Line 40, delete "are" and insert therefor -- 1s --.
Line 42, delete "are" and insert therefor -- is --.
Line 44, "include" should read -- includes --.
Line 53, delete "are" and insert therefor -- is --.
Line 61, delete "are" and insert therefor -- is --.

<u>Column 12,</u>
Line 6, delete "are" and insert therfor -- is --.
Line 8, "include" should read -- includes --.
Line 17, delete "are" and insert therefor -- is --.
Line 25, delete "are" and insert therefor -- is --.
Line 50, after "much" and insert -- more --.
Line 65, "the-edged" should read -- the edged --.

<u>Column 13,</u>
Line 4, "moved" should read -- move --.

UNITED STATES PATENT AND TRADEMARK OFFICE
CERTIFICATE OF CORRECTION

PATENT NO. : 6,325,865 B2
DATED : December 4, 2001
INVENTOR(S) : Tadayasu Ohsawa and Hiromitsu Kurauchi It is certified that error appears in the above-identified patent and that said Letters Patent is hereby corrected as shown below:

Column 14,
Line 34, "menti" should read -- ment --.

Signed and Sealed this

Eighteenth Day of June, 2002

Attest:

Attesting Officer

JAMES E. ROGAN
Director of the United States Patent and Trademark Office